United States Patent
Sagawa et al.

(10) Patent No.: US 10,950,168 B2
(45) Date of Patent: *Mar. 16, 2021

(54) DISPLAY, METHOD FOR DRIVING DISPLAY, AND ELECTRONIC APPARATUS INCLUDING A HOLDING CAPACITOR FORMED OF PARALLEL CONNECTED CAPACITORS

(71) Applicant: Sony Corporation, Tokyo (JP)

(72) Inventors: Hiroshi Sagawa, Kanagawa (JP); Katsuhide Uchino, Kanagawa (JP); Tetsuro Yamamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/426,533

(22) Filed: May 30, 2019

(65) Prior Publication Data
US 2019/0347983 A1  Nov. 14, 2019

Related U.S. Application Data

(63) Continuation of application No. 15/972,509, filed on May 7, 2018, now Pat. No. 10,354,581, which is a (Continued)

(30) Foreign Application Priority Data

Apr. 9, 2007  (JP) .................................. 2007-101282

(51) Int. Cl.
*G09G 3/30* (2006.01)
*G09G 3/3208* (2016.01)
(Continued)

(52) U.S. Cl.
CPC ......... *G09G 3/3208* (2013.01); *G09G 3/3233* (2013.01); *G09G 3/3266* (2013.01);
(Continued)

(58) Field of Classification Search
None
See application file for complete search history.

(56) References Cited

U.S. PATENT DOCUMENTS 4,621,260 A  11/1986  Suzuki et al.
4,914,546 A  4/1990  Alter
(Continued)

FOREIGN PATENT DOCUMENTS

JP  2001-109404 A  4/2001
JP  2002-032057 A  1/2002
(Continued)

OTHER PUBLICATIONS

Korean Office Action dated Aug. 27, 2019 for corresponding Korean Application No. 10-2019-0050796.
(Continued)

*Primary Examiner* — Lunyi Lao
*Assistant Examiner* — Kirk W Hermann
(74) *Attorney, Agent, or Firm* — Michael Best & Friedrich LLP

(57) ABSTRACT

Disclosed herein is a display including: a pixel array part configured to include pixels that are arranged in a matrix and each have an electro-optical element, a write transistor for writing a video signal, a drive transistor for driving the electro-optical element based on the video signal written by the write transistor, and a holding capacitor connected between gate and source of the drive transistor, wherein the holding capacitor includes a first electrode, a second electrode disposed to face one surface of the first electrode for forming a first capacitor, and a third electrode disposed to face the other surface of the first electrode for forming a second capacitor, and the first capacitor and the second capacitor are connected in parallel to each other electrically.

16 Claims, 18 Drawing Sheets

Related U.S. Application Data continuation of application No. 15/063,414, filed on Mar. 7, 2016, now Pat. No. 10,657,880, which is a continuation of application No. 13/710,161, filed on Dec. 10, 2012, now Pat. No. 9,312,315, which is a continuation of application No. 12/078,239, filed on Mar. 28, 2008, now Pat. No. 9,263,505.

(51) Int. Cl.
   *G09G 3/3233* (2016.01)
   *G09G 3/3266* (2016.01)
   *H01L 27/32* (2006.01)
   *H01L 27/12* (2006.01)
   *G09G 3/3291* (2016.01)

(52) U.S. Cl.
   CPC ...... *H01L 27/1222* (2013.01); *H01L 27/1255* (2013.01); *H01L 27/3244* (2013.01); *H01L 27/3265* (2013.01); *G09G 3/3291* (2013.01); *G09G 2300/0819* (2013.01); *G09G 2300/0842* (2013.01); *G09G 2300/0866* (2013.01); *G09G 2310/0256* (2013.01); *G09G 2320/043* (2013.01); *G09G 2320/045* (2013.01)

(56) References Cited

U.S. PATENT DOCUMENTS

| | | | |
|---|---|---|---|
| 5,723,379 | A | 3/1998 | Watanabe et al. |
| 5,886,365 | A | 3/1999 | Kouchi et al. |
| 6,245,602 | B1 | 6/2001 | Ho et al. |
| 6,747,217 | B1 | 6/2004 | Jochym et al. |
| 2004/0196223 | A1 | 10/2004 | Kwon |
| 2004/0263437 | A1 | 12/2004 | Hattori |
| 2005/0067953 | A1 | 3/2005 | Yamazaki et al. |
| 2005/0092984 | A1 | 5/2005 | Yamazaki et al. |
| 2006/0098132 | A1 | 5/2006 | Shiota et al. |
| 2006/0119753 | A1 | 6/2006 | Luo et al. |
| 2006/0290274 | A1 | 12/2006 | Oota |
| 2007/0001595 | A1 | 1/2007 | Nakagawa |
| 2007/0046591 | A1 | 3/2007 | Shishido et al. |
| 2007/0063959 | A1 | 3/2007 | Iwabuchi et al. |
| 2007/0126665 | A1 | 6/2007 | Kimura |

FOREIGN PATENT DOCUMENTS

| | | | |
|---|---|---|---|
| JP | 2002-311857 | A | 10/2002 |
| JP | 2003-241687 | A | 8/2003 |
| JP | 2003-255897 | A | 9/2003 |
| JP | 2003-271095 | A | 9/2003 |
| JP | 2005-227562 | A | 8/2005 |
| JP | 2005227562 | A * | 8/2005 |
| JP | 2006-133542 | | 5/2006 |
| JP | 2006-215213 | A | 8/2006 |
| JP | 2006-215275 | A | 8/2006 |
| JP | 2006-258923 | A | 9/2006 |
| JP | 2007-041571 | A | 2/2007 |
| KR | 2006-0088828 | A | 8/2006 |
| KR | 101976085 | B1 | 5/2019 |

OTHER PUBLICATIONS

Korean Office Action dated Apr. 22, 2014 for corresponding Korean Application No. 10-2008-0031044.
Korean Office Action dated Nov. 25, 2014 for corresponding Korean Application No. 10-2008-31044.
Korean Office Action dated Mar. 27, 2015 for corresponding Korean Application No. 10-2014-91855.
Korean Office Action dated May 22, 2015 for corresponding Korean Application No. 10-2008-31044.
Korean Office Action dated Feb. 26, 2016 for corresponding Korean Application No. 10-2015-0068133.
U.S. Office Action dated Jul. 26, 2018 for related U.S. Appl. No. 15/063,414.

* cited by examiner

BEFORE t=t1 t=t1 t=t2 t=t t=t4 t=t5 t=t6 t=t7

WITHOUT THRESHOLD CORRECTION, WITHOUT MOBILITY CORRECTION

WITH THRESHOLD CORRECTION, WITHOUT MOBILITY CORRECTION

WITH THRESHOLD CORRECTION, WITH MOBILITY CORRECTION

■ FIRST METAL LAYER ◉ CONTACT BETWEEN FIRST METAL LAYER AND SECOND METAL LAYER

▨ SECOND METAL LAYER ◻ CONTACT BETWEEN SECOND METAL LAYER AND THIRD METAL LAYER

⌐ ¬ THIRD METAL LAYER ⌐ ¬ FORMATION AREA OF
L ⌐ ⌐ ⌐ L ⌐ HOLDING CAPACITOR

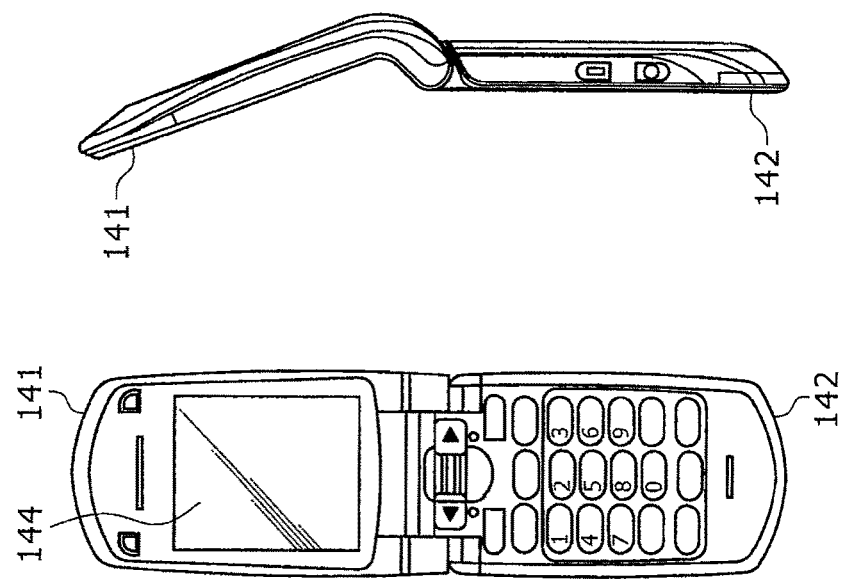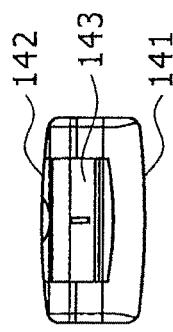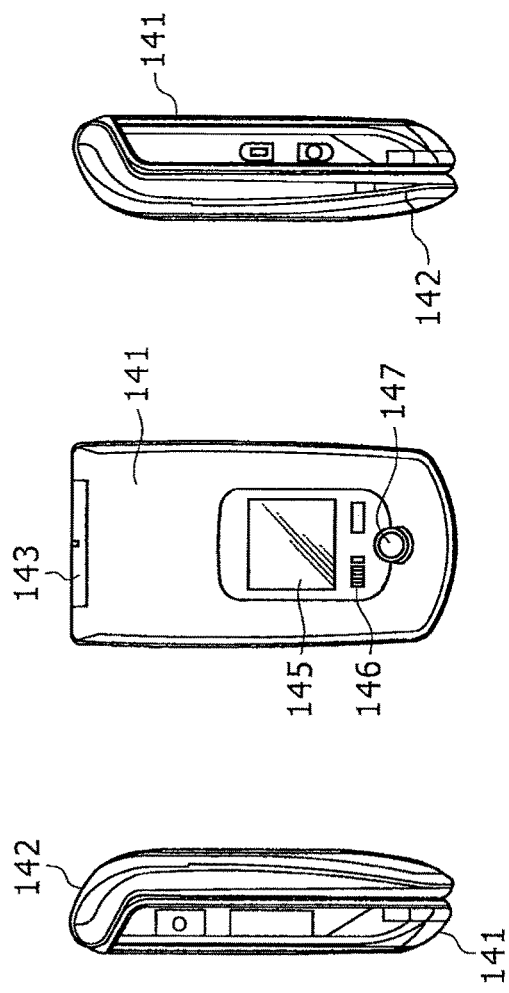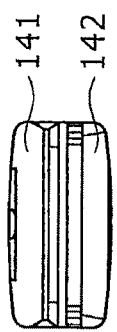

DISPLAY, METHOD FOR DRIVING DISPLAY, AND ELECTRONIC APPARATUS INCLUDING A HOLDING CAPACITOR FORMED OF PARALLEL CONNECTED CAPACITORS

CROSS REFERENCES TO RELATED APPLICATIONS

This present application is a Continuation of U.S. application Ser. No. 15/972,509, filed May 7, 2018, which is a Continuation of U.S. application Ser. No. 15/063,414, filed Mar. 7, 2016, which is a Continuation of U.S. application Ser. No. 13/710,161, filed Dec. 10, 2012, now U.S. Pat. No. 9,312,315, issued Apr. 12, 2016, which is a Continuation of U.S. application Ser. No. 12/078,239, filed Mar. 28, 2008, now U.S. Pat. No. 9,263,505, issued Feb. 16, 2016, which contains subject matter related to Japanese Patent Application JP 2007-101282 filed in the Japan Patent Office on Apr. 9, 2007, the entire contents of which being incorporated herein by reference.

BACKGROUND OF THE INVENTION

1. Field of the Invention

The present invention relates to a display, a method for driving a display, and electronic apparatus, and particularly to a flat-type (flat-panel) display in which pixels, each including an electro-optical element, are arranged on rows and columns (in a matrix), a method for driving the display, and electronic apparatus including the display.

2. Description of the Related Art

In recent years, in the field of displays for image displaying, flat-type display obtained by arranging pixels (pixel circuits) each including a light-emitting element in a matrix is prevailing rapidly. As the flat-type display, an organic electroluminescence (EL) display is being developed and commercialized. The organic EL display includes organic EL elements as the light-emitting elements of the respective pixels. The organic EL element is a so-called current-driven electro-optical element whose light-emission luminance varies depending on the value of the current flowing through the element, and is based on a phenomenon that light emission occurs in response to electric field application to an organic thin film.

The organic EL display has the following features. Specifically, the organic EL display has low power consumption because the organic EL element can be driven by an application voltage lower than 10 V. Furthermore, because the organic EL element is a self-luminous element, the organic EL display provides higher image visibility compared with a liquid crystal display, which displays an image by controlling, for each pixel including a liquid crystal cell, the intensity of light from a light source (backlight) by the liquid crystal cell. In addition, the organic EL display does not need to have an illuminating unit such as a backlight, which is necessary for the liquid crystal display, and therefore reduction in the weight and thickness of the organic EL display can be easily achieved. Moreover, the response speed of the organic EL element is as high as several microseconds, which causes no image lag in displaying of a moving image by the organic EL display.

As the drive system for the organic EL display, a simple-(passive-) matrix system or an active-matrix system can be employed, similar to the liquid crystal display. However, a display of the simple-matrix system involves a problem that it is difficult to realize a large-size and high-definition display since the light-emitting period of the light-emitting element is decreased due to the increase of the scanning line (i.e. number of pixels) although the configuration thereof is simple.

For this reason, in recent years, a display of the active-matrix system is being actively developed in which the current flowing through an electro-optical element is controlled by an active element, such as an insulated gate field effect transistor (typically, thin film transistor (TFT)), provided in the same pixel circuit as that including this electro-optical element. In the display of the active-matrix system, the electro-optical element continues light emission over the one-frame period. This easily realizes a display having a large size and high definition.

It is generally known that the I-V characteristic (current-voltage characteristic) of an organic EL element deteriorates as the time elapses (so-called age deterioration). In a pixel circuit including an N-channel TFT as a transistor for driving an organic EL element by current (hereinafter, referred to as a "drive transistor"), the organic EL element is connected to the source side of the drive transistor. Therefore, the age deterioration of the I-V characteristic of the organic EL element leads to change in the gate-source voltage Vgs of the drive transistor, which results in change in the light-emission luminance of the organic EL element.

A more specific description will be made below about this point. The source potential of the drive transistor is dependent on the operating point of the drive transistor and the organic EL element. The deterioration of the I-V characteristic of the organic EL element varies the operating point of the drive transistor and the organic EL element. Therefore, even when the same voltage is applied to the gate of the drive transistor, the source potential of the drive transistor varies. This varies the source-gate voltage Vgs of the drive transistor, which changes the value of the current flowing through the drive transistor. As a result, the value of the current flowing through the organic EL element also changes, which varies the light-emission luminance of the organic EL element.

Furthermore, a pixel circuit employing a poly-silicon TFT involves, in addition to the age deterioration of the I-V characteristic of the organic EL element, changes over time in the threshold voltage Vth of the drive transistor and the mobility $\mu$ in the semiconductor thin film serving as the channel of the drive transistor (hereinafter, referred to as "the mobility of the drive transistor"), and differences in the threshold voltage Vth and the mobility $\mu$ from pixel to pixel due to variation in the manufacturing process (variation in transistor characteristics among the respective drive transistors).

If the threshold voltage Vth and mobility $\mu$ of the drive transistor are different from pixel to pixel, variation in the value of the current flowing through the drive transistor arises on a pixel-by-pixel basis. Therefore, even when the same voltage is applied to the gate of the drive transistor among the pixels, variation in the light-emission luminance of the organic EL element among the pixels arises, which results in lowered uniformity of the screen.

To address this problem, there has been proposed a configuration aiming to allow the light-emission luminance of the organic EL element to be kept constant without being affected by the age deterioration of the I-V characteristic of the organic EL element and changes over time in the threshold voltage Vth and mobility $\mu$ of the drive transistor.

Specifically, in this configuration, each of pixel circuits is provided with a compensation function against change in the characteristic of the organic EL element, and correction functions for correction against variation in the threshold voltage Vth of the drive transistor (hereinafter, referred to as "threshold correction") and correction against variation in the mobility μ of the drive transistor (hereinafter, referred to as "mobility correction") (refer to e.g. Japanese Patent Laid-Open No. 2006-133542 (hereinafter referred to as Patent Document 1)).

By thus providing each pixel circuit with the compensation function against change in the characteristic of the organic EL element and the correction functions against variation in the threshold voltage Vth and mobility μ of the drive transistor, the light-emission luminance of the organic EL element can be kept constant without being affected by the age deterioration of the I-V characteristic of the organic EL element and changes over time in the threshold voltage Vth and mobility μ of the drive transistor.

The compensation function against change in the characteristic of the organic EL element is implemented through the following series of circuit operation. Initially, at the timing when a video signal supplied via a signal line is written by a write transistor and is held in a holding capacitor connected between the gate and source of the drive transistor, the write transistor is turned to the non-conductive state to thereby electrically separate the gate electrode of the drive transistor from the signal line for turning the gate electrode to the floating state.

If the gate electrode of the drive transistor enters the floating state, in response to change in the source potential Vs of the drive transistor, the gate potential Vg of the drive transistor also changes in linkage with (in such a manner as to follow) the change in the source potential Vs, due to the connection of the holding capacitor between the gate and source of the drive transistor. This is a bootstrap operation. Due to the bootstrap operation, the gate-source voltage Vgs of the drive transistor can be kept constant. Thus, even when the I-V characteristic of the organic EL element changes over time, the light-emission luminance of the organic EL element can be kept constant.

In this bootstrap operation, the ratio of the rise amount ΔVg of the gate potential Vg of the drive transistor to the rise amount ΔVs of the source potential Vs thereof (hereinafter, referred to as a bootstrap ratio Gbst) is an important factor. Specifically, if this bootstrap ratio Gbst is low, the gate-source voltage Vgs of the drive transistor becomes lower than the voltage obtained at the timing when the video signal is held in the holding capacitor.

The low bootstrap ratio Gbst is equivalent to the fact that the rise amount ΔVg of the gate potential Vg is small with respect to the rise amount ΔVs of the source potential Vs. Therefore, the gate-source voltage Vgs becomes lower. This leads to failure in ensuring of the current necessary as the drive current to be applied to the organic EL element, i.e., the current corresponding to the video signal written by the write transistor, which results in luminance lowering. Thus, luminance unevenness occurs, which causes the deterioration of the image quality.

The bootstrap ratio Gbst depends on the capacitance of the holding capacitor and the capacitances of parasitic capacitors attaching to the gate of the drive transistor. The higher the capacitances of these capacitors are, the higher the bootstrap ratio Gbst is (details of this point will be described later). The capacitance of the parasitic capacitances depends on circuit elements, such as a transistor, connected to the gate electrode of the drive transistor. If the number of elements included in the pixel circuit is reduced and consequently the number of transistors connected to the gate electrode of the drive transistor is decreased, the capacitance of the parasitic capacitors becomes lower correspondingly.

Therefore, increasing the capacitance of the holding capacitor is effective to increase the bootstrap ratio Gbst. The capacitance of the holding capacitor is in proportion to the area of two metal electrodes that form the holding capacitor and are disposed to face each other, and is in inverse proportion to the distance between these two metal electrodes. Therefore, the capacitance of the holding capacitor can be increased by increasing the area of two metal electrodes or decreasing the distance between two metal electrodes. Because there is a limit to the decreasing of the distance between two metal electrodes, the increasing of the area of two metal electrodes, i.e., increasing of the size of the holding capacitor, is preferentially attempted.

However, because the holding capacitor is formed under the condition of the limited pixel size, there is also a limit to the increasing of the size of the holding capacitor. On the contrary, the recent trend toward miniaturization of the pixel size accompanying definition enhancement makes it difficult to increase the bootstrap ratio Gbst through the increasing of the size of the holding capacitor.

As another scheme, it would be available to ensure the drive current corresponding to the video signal by, instead of increasing the bootstrap ratio Gbst, originally designing a large current as the drive current to be applied to the organic EL element via the drive transistor in anticipation of the voltage decrease corresponding to the bootstrap ratio Gbst. However, this scheme involves a problem of an increase in the power consumption.

SUMMARY OF THE INVENTION

There is a need for the present invention to provide a display that is allowed to have enhanced image quality without an increase in the power consumption through designing of a high bootstrap ratio under the condition of the limited pixel size, and to provide a method for manufacturing the display, and electronic apparatus employing the display.

According to an embodiment of the present invention, there is provided a display including pixels that are arranged in a matrix, each having an electro-optical element, a write transistor for writing a video signal, a drive transistor for driving the electro-optical element based on the video signal written by the write transistor, and a holding capacitor connected between the gate and source of the drive transistor. In this display, the holding capacitor is formed by using a first electrode, a second electrode disposed to face one surface of the first electrode for forming a first capacitor, and a third electrode disposed to face the other surface of the first electrode for forming a second capacitor, and the first capacitor and the second capacitor are connected in parallel to each other electrically.

According to the display having this configuration and the electronic apparatus including this display, by forming the first and second capacitors by using the first, second, and third electrodes and connecting these first and second capacitors in parallel to each other electrically, the capacitance of the holding capacitor can be increased without increasing the size of the holding capacitor compared with a holding capacitor formed by using two electrodes, if the distances among the first, second, and third electrodes are equalized to each other. Thus, a high bootstrap ratio can be designed under the condition of the limited pixel size.

Because the bootstrap ratio can be set high, when the source potential of the drive transistor rises up, the rise amount of the gate potential is substantially equal to the rise amount of the source potential in bootstrap operation, and thus the gate-source voltage of the drive transistor is not reduced. This allows ensuring of the current necessary as the drive current to be applied to the electro-optical element without originally designing a large current as the drive current in anticipation of the voltage decrease corresponding to the bootstrap ratio.

According to the embodiment of the present invention, a high bootstrap ratio can be designed under the condition of the limited pixel size, and thus the current necessary as the drive current to be applied to the electro-optical element can be ensured without originally designing a large current as the drive current in anticipation of the voltage decrease corresponding to the bootstrap ratio. This can enhance the image quality without increasing the power consumption.

Furthermore, if the same capacitance as that of a capacitor formed by using two electrodes is designed without attempting to increase the capacitance of the holding capacitor, the area of the electrodes of the holding capacitor can be decreased. Thus, the ratio of the area of the electrodes of the holding capacitor to the total area of the pixel is reduced. For example, this makes it possible to suppress the occurrence of short-circuit due to a metal dust or the like that enters the pixel in the manufacturing process and hence a fault in the pixel, which can enhance the yield.

BRIEF DESCRIPTION OF THE DRAWINGS

FIG. 18A is a front-side view and FIG. 18B is a rear-side view;

FIGS. 21A to 21G are perspective views showing a cellular phone to which the embodiment is applied: FIGS. 21A and 21B are a front view and side view, respectively, of the opened state, and FIGS. 21C to 21G are a front view, left-side view, right-side view, top view, and bottom view, respectively, of the closed state.

DETAILED DESCRIPTION OF THE PREFERRED EMBODIMENT

An embodiment of the present invention will be described in detail below with reference to the accompanying drawings.

Figure 1:
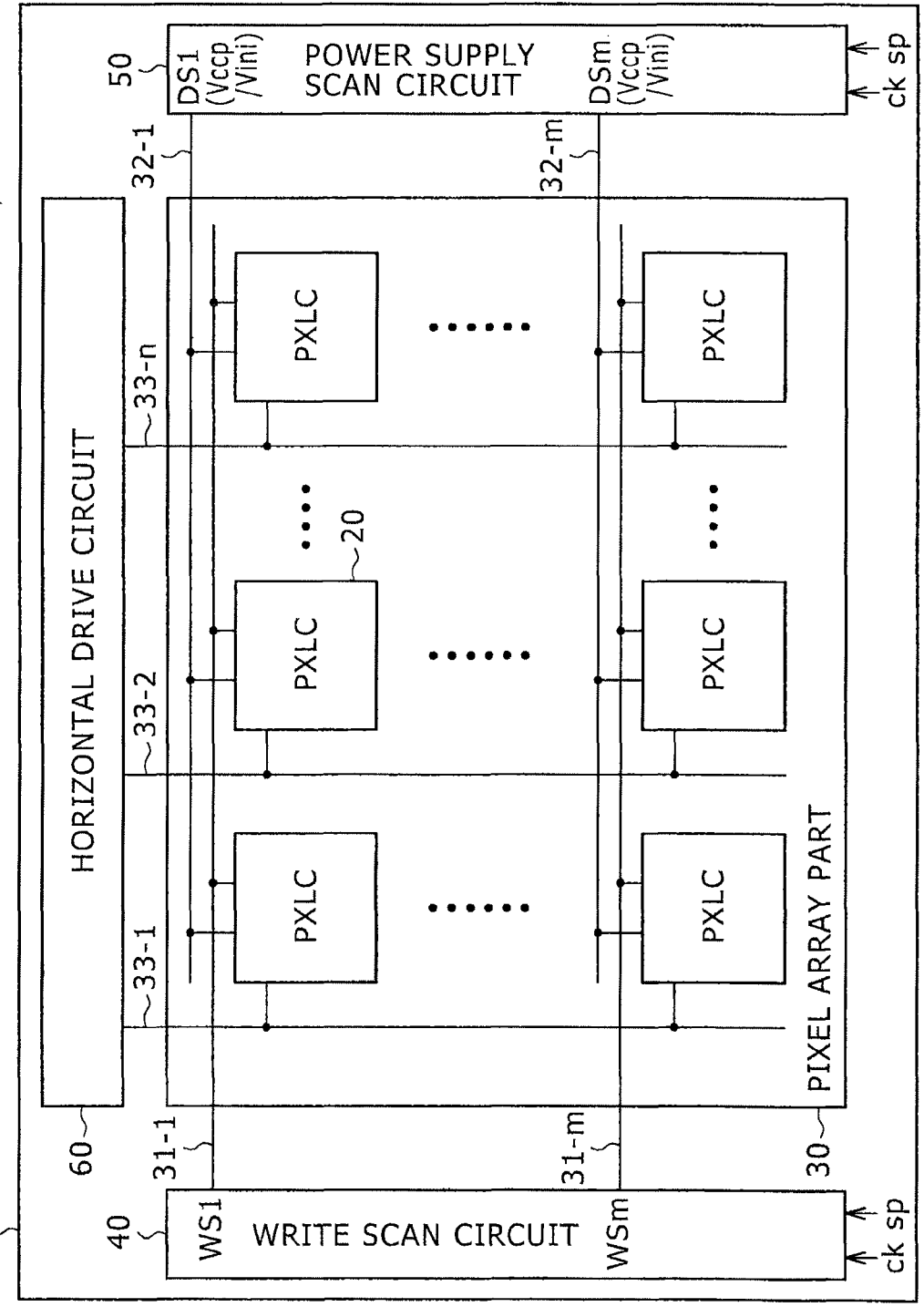
FIG. 1 is a system configuration diagram showing the schematic configuration of an organic EL display according to one embodiment of the present invention.

FIG. 1 is a system configuration diagram showing the schematic configuration of an active-matrix display according to one embodiment of the present invention. As one example, the following description will deal with an active-matrix organic EL display that employs, as a light-emitting element of each pixel (pixel circuit), an organic EL element, which is a current-driven electro-optical element whose light-emission luminance varies depending on the current flowing through the element.

As shown in FIG. 1, an organic EL display 10 according to the present embodiment includes a pixel array part 30 in which pixels (PXLC) 20 are two-dimensionally arranged on rows and columns (in a matrix). Furthermore, the organic EL display 10 includes a driving part that is disposed in the periphery of the pixel array part 30 and drives the respective pixels 20. The driving part includes a write scan circuit 40, a power supply scan circuit 50, and a horizontal drive circuit 60 as the driving part for example.

In the pixel array part 30, corresponding to the pixel arrangement of m rows and n columns, scan lines 31-1 to 31-m and power supply lines 32-1 to 32-m are provided for the respective pixel rows, and signal lines 33-1 to 33-n are provided for the respective pixel columns.

The pixel array part 30 is typically formed on a transparent insulating substrate such as a glass substrate, and has a flat-type panel structure. Each of the pixels 20 in the pixel array part 30 can be formed by using an amorphous silicon thin film transistor (TFT) or a low-temperature poly-silicon TFT. In the case of using the low-temperature poly-silicon TFT, the scan circuit 40, the power supply scan circuit 50, and the horizontal drive circuit 60 can also be mounted on a display panel (substrate) 70 on which the pixel array part 30 is formed.

The write scan circuit 40 includes a shift register for sequentially shifting (transferring) a start pulse sp in synchronization with a clock pulse ck. For writing of the video signal to the pixels 20 in the pixel array part 30, the write scan circuit 40 sequentially supplies scan signals WS1 to WSm to the scan lines 31-1 to 31-*m*, for sequential scanning of the pixels 20 on a row-by-row basis (line-sequential scanning).

The power supply scan circuit 50 includes a shift register for sequentially shifting the start pulse sp in synchronization with the clock pulse ck. In synchronization with the line-sequential scanning by the write scan circuit 40, the power supply scan circuit 50 supplies the power supply lines 32-1 to 32-*m* with power supply line potentials DS1 to DSm that are each switched between a first potential Vccp and a second potential Vini lower than the first potential Vccp, to thereby control the conductive state (ON)/non-conductive state (OFF) of a drive transistor 22 (see FIG. 2) to be described later.

The horizontal drive circuit 60 properly selects either one of a signal voltage Vsig and an offset voltage Vofs of the video signal that is supplied from a signal supply source (not shown) and corresponds to luminance information, and writes the video signal to the pixels 20 in the pixel array part 30 via the signal lines 33-1 to 33-*n* simultaneously e.g. in units of rows. That is, the horizontal drive circuit 60 employs a drive form for line-sequential writing in which the signal voltage Vsig of the video signal is simultaneously written in units of rows (lines).

The offset voltage Vofs is the voltage serving as the reference (equivalent to e.g. the black level) of the signal voltage (hereinafter, it will be often referred to simply as "signal voltage") Vsig of the video signal. The second potential Vini is set to a potential sufficiently lower than the offset voltage Vofs; it is set to e.g. a potential that satisfies the relationship Vofs−Vth>Vini, in which Vth denotes the threshold voltage of the drive transistor 22.

(Pixel Circuit)

Figure 2:
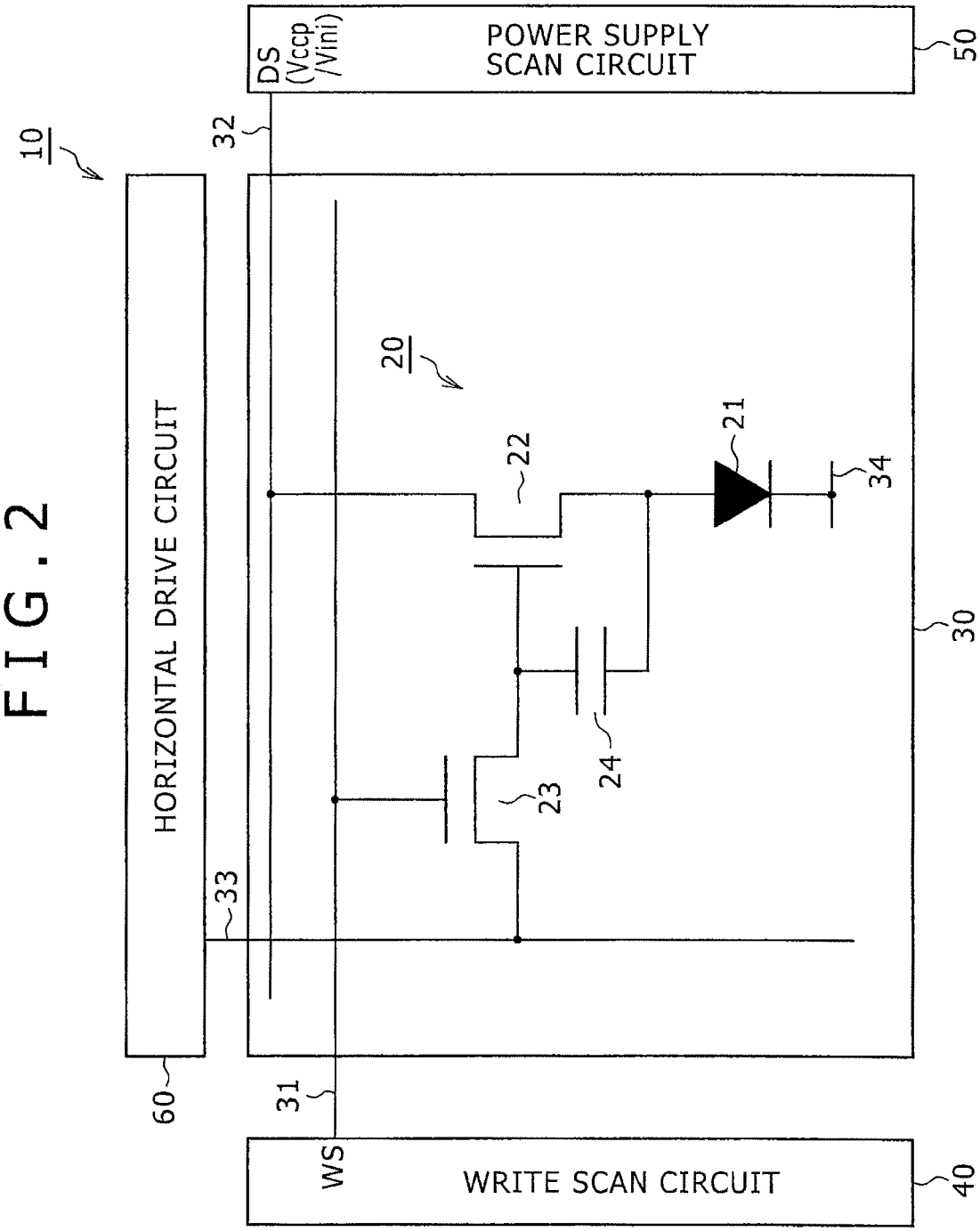
FIG. 2 is a circuit diagram showing a specific configuration example of a pixel (pixel circuit)

FIG. 2 is a circuit diagram showing a specific configuration example of the pixel (pixel circuit) 20. As shown in FIG. 2, the pixel 20 includes, as a light-emitting element, an organic EL element 21, which is a current-driven electro-optical element whose light-emission luminance varies depending on the current flowing through the element. In addition to the organic EL element 21, the pixel 20 includes a drive transistor 22, a write transistor 23, and a holding capacitor 24.

In this combination, N-channel TFTs are used as the drive transistor 22 and the write transistor 23. This combination of the conductivity types of the drive transistor 22 and the write transistor 23 is merely one example, and the combination is not limited thereto.

The cathode electrode of the organic EL element 21 is connected to a common power supply line 34 that is provided in common to all the pixels 20. The source electrode of the drive transistor 22 is connected to the anode electrode of the organic EL element 21, and the drain electrode of the drive transistor 22 is connected to the power supply line 32 (32-1 to 32-*m*).

The gate electrode of the write transistor 23 is connected to the scan line 31 (31-1 to 31-*m*). One electrode (source electrode/drain electrode) of the write transistor 23 is connected to the signal line 33 (33-1 to 33-*n*), and the other electrode (drain electrode/source electrode) thereof is connected to the gate electrode of the drive transistor 22.

One end of the holding capacitor 24 is connected to the gate electrode of the drive transistor 22, and the other end thereof is connected to the source electrode of the drive transistor 22 (the anode electrode of the organic EL element 21). It is also possible to employ a configuration in which an auxiliary capacitor is connected in parallel to this holding capacitor 24 to thereby compensate for any insufficiency of the capacitance of the holding capacitor 24.

In the pixel 20 having such a configuration, the write transistor 23 enters the conductive state in response to the scan signal WS applied to the gate electrode thereof from the write scan circuit 40 via the scan line 31. Thereby, the write transistor 23 samples the signal voltage Vsig or the offset voltage Vofs of the video signal that is supplied from the horizontal drive circuit 60 via the signal line 33 and depends on luminance information, and writes the sampled voltage in the pixel 20. This written input signal voltage Vsig or offset voltage Vofs is held in the holding capacitor 24.

When the potential DS of the power supply line 32 (32-1 to 32-*m*) is at the first potential Vccp, the drive transistor 22 is supplied with current from the power supply line 32 and supplies the organic EL element 21 with drive current having the current value dependent upon the voltage value of the input signal voltage Vsig held in the holding capacitor 24, to thereby drive the organic EL element 21 by the current.

(Pixel Structure)

Figure 3:
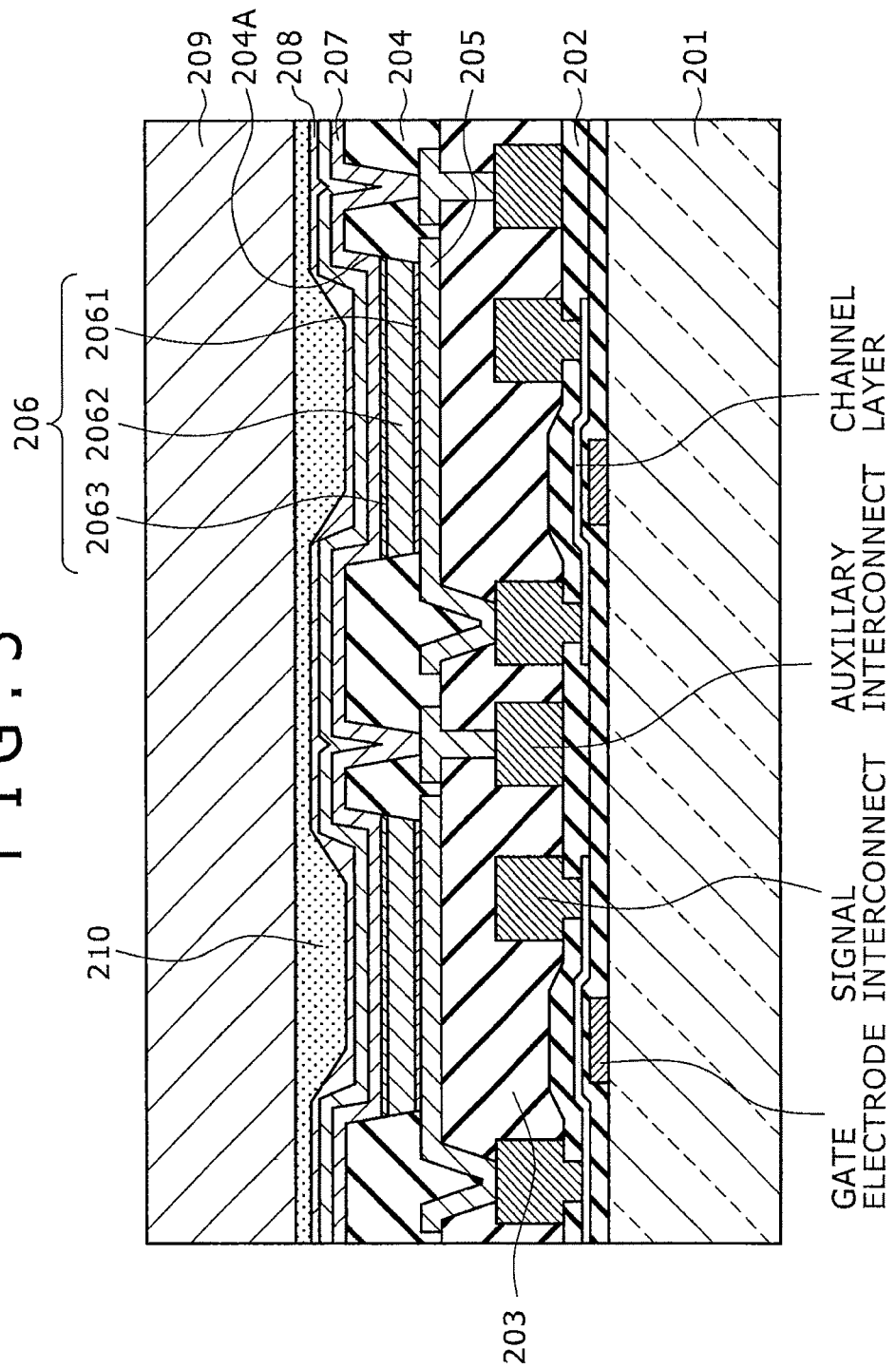
FIG. 3 is a sectional view showing one example of the sectional structure of the pixel.

FIG. 3 is a sectional view showing one example of the sectional structure of the pixel 20. As shown in FIG. 3, the pixel 20 has a structure in which an insulating film 202, an insulating planarization film 203 and a window insulating film 204 are formed sequentially over a glass substrate 201 on which the pixel circuit composed of the drive transistor 22, the write transistor 23, and so on is formed, and the organic EL element 21 is provided in a recess 204A of the window insulating film 204.

The organic EL element 21 is composed of an anode electrode 205 that is formed at the bottom of the recess 204A of the window insulating film 204 and is composed of a metal or the like, an organic layer (electron transport layer, light-emitting layer, hole transport layer/hole injection layer) 206 formed on the anode electrode 205, and a cathode electrode 207 that is formed on the organic layer 206 in common to all the pixels and is formed of a transparent conductive film or the like.

In this organic EL element 21, the organic layer 206 is formed by sequentially depositing over the anode electrode 205 a hole transport layer/hole injection layer 2061, a light-emitting layer 2062, an electron transport layer 2063, and an electron injection layer (not shown). Under driving by current by the drive transistor 22 of FIG. 2, current flows through the organic layer 206 from the drive transistor 22 via the anode electrode 205. This causes the recombination between electrons and holes in the light-emitting layer 2062 in the organic layer 206, and light is emitted in response to this recombination.

As shown in FIG. 3, after the organic EL element 21 is formed for each pixel over the glass substrate 201 on which the pixel circuit is formed with the intermediary of the insulating film 202, an insulating planarization film 203 and the window insulating film 204, a sealing substrate 209 is bonded by an adhesive 210 with the intermediary of a passivation film 208 so that the organic EL element 21 is sealed by the sealing substrate 209. This completes the display panel 70.

(Threshold Correction Function)

In the period during which the horizontal drive circuit 60 supplies the offset voltage Vofs to the signal line 33 (33-1 to 33-*m*) after the write transistor 23 enters the conductive state, the power supply scan circuit 50 switches the potential DS of the power supply line 33 from the second potential Vini to the first potential Vccp. Due to the switching of the potential DS of the power supply line 32, the voltage equivalent to the threshold voltage Vth of the drive transistor 22 is held in the holding capacitor 24.

The holding of the voltage equivalent to the threshold voltage Vth of the drive transistor 22 in the holding capacitor 24 is for the following reason.

Due to variation in the manufacturing process for the drive transistor 22 and change in the drive transistor 22 over time, there is variation in the transistor characteristics of the drive transistor 22, such as the threshold voltage Vth and the mobility μ, from each pixel. Due to the variation in transistor characteristics, even when the same gate potential is applied to the drive transistor 22 among the pixels, the drain-source current (drive current) Ids varies from pixel to pixel, and this current variation will appear as variation in the light-emission luminance of the organic EL element 21. In order to cancel (correct) the influence of the variation in the threshold voltage Vth from pixel to pixel, the voltage equivalent to the threshold voltage Vth is held in the holding capacitor 24.

The correction of the threshold voltage Vth of the drive transistor 22 is carried out as follows. Specifically, the threshold voltage Vth is held in the holding capacitor 24 in advance. Due to this operation, in the driving of the drive transistor 22 by the signal voltage Vsig of the video signal, the threshold voltage Vth of the drive transistor 22 and the voltage that is held in the holding capacitor 24 and is equivalent to the threshold voltage Vth cancel each other. In other words, the correction of the threshold voltage Vth is carried out.

This corresponds to the threshold correction function. Due to this threshold correction function, even when there is variation and change over time in the threshold voltage Vth from pixel to pixel, the light-emission luminance of the organic EL element 21 can be kept constant without being affected by the variation and the change over time. The principle of the threshold correction will be described in detail later.

(Mobility Correction Function)

The pixel 20 shown in FIG. 2 is provided with the mobility correction function in addition to the above-described threshold correction function. Specifically, during the period when the horizontal drive circuit 60 supplies the signal voltage Vsig of the video signal to the signal line 33 (33-1 to 33-n) and the write transistor 23 is in the conductive state in response to the scan signal WS (WS1 to WSm) output from the write scan circuit 40, i.e., during the mobility correction period, mobility correction of cancelling the dependence of the drain-source current Ids of the drive transistor 22 on the mobility μ is carried out in the holding of the input signal voltage Vsig in the holding capacitor 24. The specific principle and operation of this mobility correction will be described later.

(Bootstrap Function)

The pixel 20 shown in FIG. 2 is also provided with a bootstrap function. Specifically, at the timing when the signal voltage Vsig of the video signal has been held in the holding capacitor 24, the write scan circuit 40 stops the supply of the scan signal WS (WS1 to WSm) to the scan line 31 (31-1 to 31-m) to thereby switch the write transistor 23 to the non-conductive state for electrically isolating the gate electrode of the drive transistor 22 from the signal line 33 (33-1 to 33-n). Thus, the gate electrode of the drive transistor 22 enters the floating state.

If the gate electrode of the drive transistor 22 enters the floating state, in response to change in the source potential Vs of the drive transistor 22, the gate potential Vg of the drive transistor 22 also changes in linkage with (in such a manner as to follow) the change in the source potential Vs, due to the connection of the holding capacitor 24 between the gate and source of the drive transistor 22 (bootstrap operation). Due to this bootstrap operation, even when the I-V characteristic of the organic EL element 21 changes over time, the light-emission luminance of the organic EL element 21 can be kept constant.

Specifically, even when the I-V characteristic of the organic EL element 21 has changed over time and correspondingly the source potential Vs of the drive transistor 22 has changed, the gate-source voltage Vgs of the drive transistor 22 is kept constant due to the bootstrap operation. Thus, the current flowing through the organic EL element 21 does not change, and hence the light-emission luminance of the organic EL element 21 is also kept constant. Consequently, even when the I-V characteristic of the organic EL element 21 changes over time, image displaying without luminance deterioration accompanying the change over time is permitted.

(Circuit Operation of Organic EL Display)

Subsequently, the circuit operation of the organic EL display 10 according to the present embodiment will be described below based on the timing chart of FIG. 4 with reference to the operation explanatory diagrams of FIGS. 5 and 6. In the operation explanatory diagrams of FIGS. 5 and 6, the write transistor 23 is represented by a switch symbol for simplification of the drawings. Furthermore, because the organic EL element 21 has a parasitic capacitor Cel, this parasitic capacitor Cel is also shown in these diagrams.

In the timing chart of FIG. 4, changes in the following potentials at the 1-H (H denotes horizontal scanning period) are shown along the same time axis: the potential (scan signal) WS of the scan line 31 (31-1 to 31-m), the potential DS of the power supply line 32 (32-1 to 32-m), and the gate potential Vg and source potential Vs of the drive transistor 22.

<Light-Emission Period>

Figure 4:
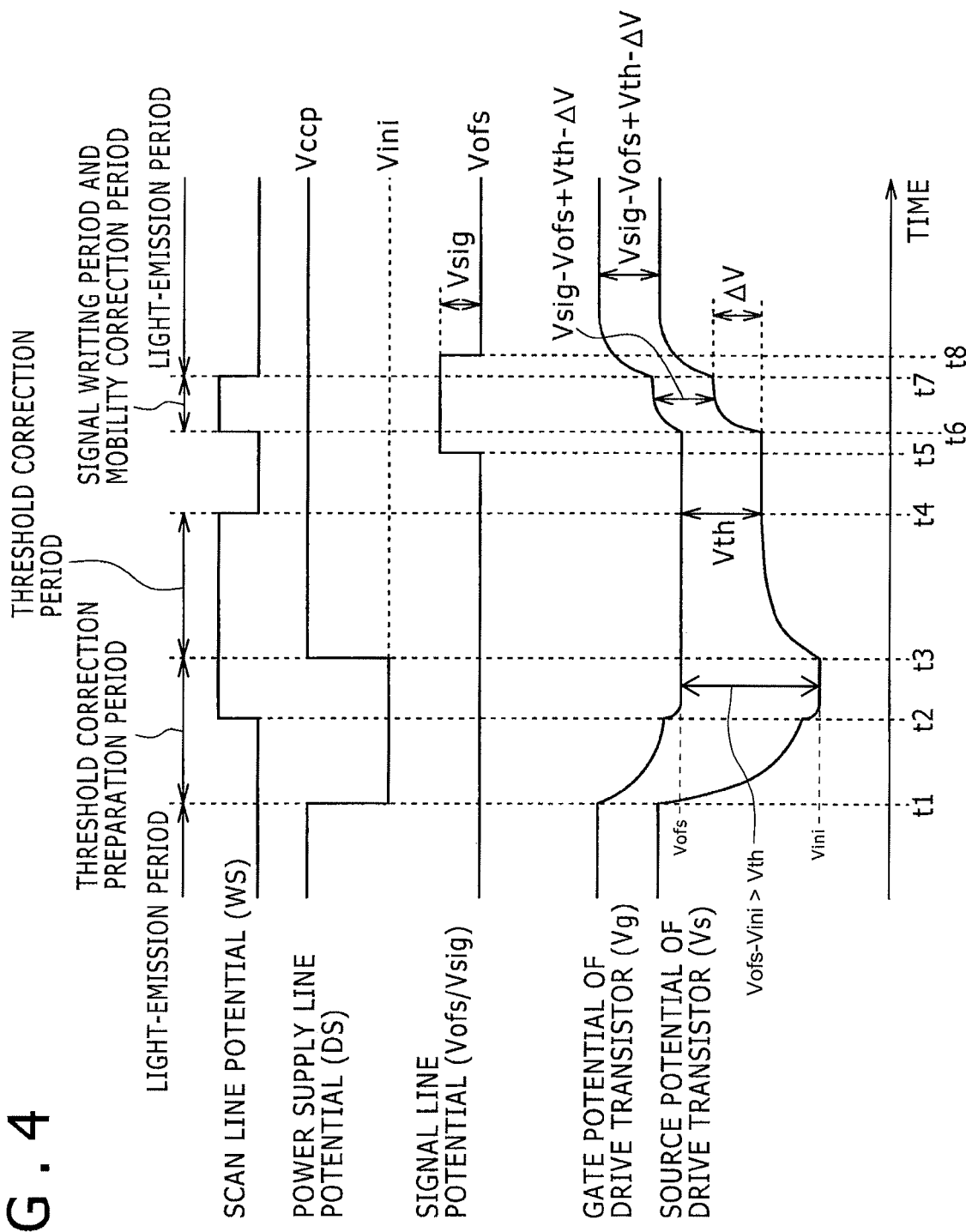
FIG. 4 is a timing chart for explaining the operation of the organic EL display according to the embodiment.
Figure 5A:
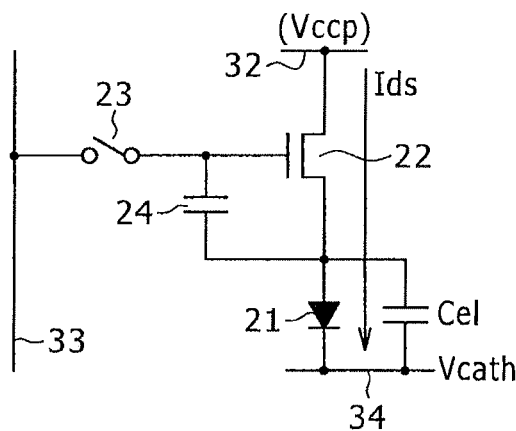
FIGS. 5A to 5D are explanatory diagrams of circuit operation in the organic EL display according to the embodiment.

According to the timing chart of FIG. 4, the organic EL element 21 is in the light-emission state before time t1 (light-emission period). In this light-emission period, the potential DS of the power supply line 32 is at the higher potential Vccp (first potential), and the write transistor 23 is in the non-conductive state. The drive transistor 22 is so designed as to operate in the saturation region in this period. Therefore, as shown in FIG. 5A, the drive current (drain-source current) Ids dependent upon the gate-source voltage Vgs of the drive transistor 22 is supplied to the organic EL element 21 from the power supply line 32 via the drive transistor 22. This causes the organic EL element 21 to emit light with the luminance dependent upon the current value of the drive current Ids.

<Threshold Correction Preparation Period>

Figure 5B:
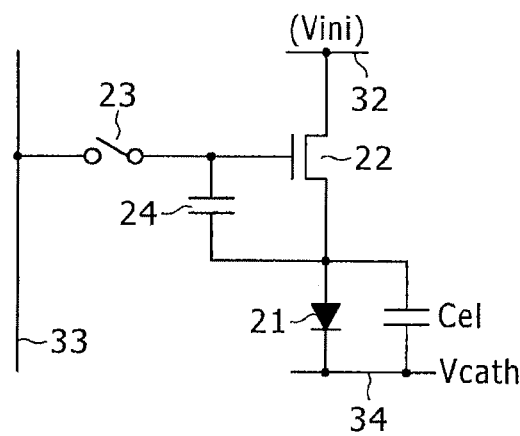

At the time t1, a new field of the line-sequential scanning starts, and as shown in FIG. 5B, the potential DS of the power supply line 32 is switched from the higher potential Vccp to the potential Vini (second potential) sufficiently lower than the offset voltage Vofs of the signal line 33. Under the definition that the threshold voltage of the organic EL element 21 is Vel and the potential of the common power supply line 34 is Vcath, if the lower potential Vini is set to satisfy the relationship Vini<Vel+Vcath, the organic EL element 21 enters the reverse-bias state and thus the light emission thereof stops because the source potential Vs of the drive transistor 22 becomes almost equal to the lower potential Vini.

Figure 5C:
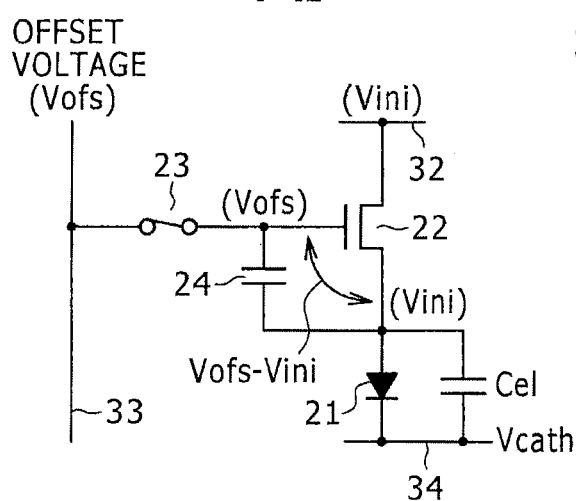

Subsequently, the potential WS of the scan line 31 is switched from a lower potential side to a higher potential side at time t2 so that the write transistor 23 enters the conductive state, as shown in FIG. 5C. At this time, the offset voltage Vofs is supplied from the horizontal drive circuit 60 to the signal line 33. Thus, the gate potential Vg of the drive transistor 22 becomes equal to the offset voltage Vofs. The source potential Vs of the drive transistor 22 is at the potential Vini sufficiently lower than the offset voltage Vofs.

At this time, the gate-source voltage Vgs of the drive transistor 22 is Vofs−Vini. At this time, unless this voltage Vofs−Vini is higher than the threshold voltage Vth of the drive transistor 22, the above-described threshold correction operation may not be carried out. Thus, the potentials should be so designed as to satisfy the relationship Vofs−Vini>Vth. This operation of fixing (settling) the gate potential Vg of the drive transistor 22 at the offset voltage Vofs and fixing the source potential Vs at the lower potential Vini for initialization in this manner corresponds to the operation of the threshold correction preparation.

<Threshold Correction Period>

Figure 5D:
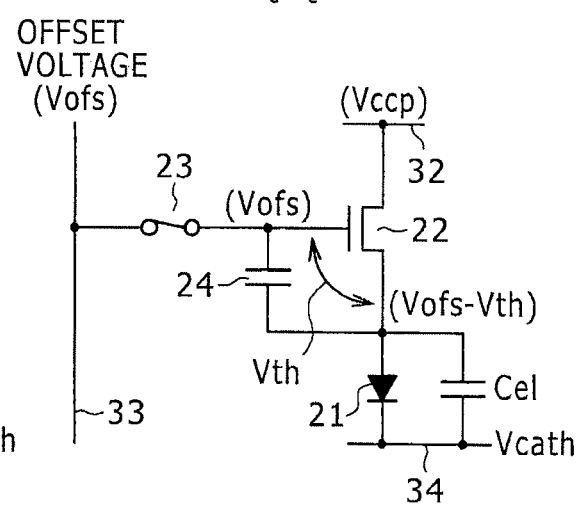

Subsequently, as shown in FIG. 5D, upon switching of the potential DS of the power supply line 32 from the lower potential Vini to the higher potential Vccp at the time t3, the source potential Vs of the drive transistor 22 starts to rise. In due course, the source potential Vs of the drive transistor 22 reaches the potential Vofs−Vth. At this time, the gate-source voltage Vgs of the drive transistor 22 is equal to the threshold voltage Vth of the drive transistor 22 so that the voltage equivalent to this threshold voltage Vth is written to the holding capacitor 24.

In the present specification, the period for writing the voltage equivalent to the threshold voltage Vth in the holding capacitor 24 is referred to as the threshold correction period, for convenience. The potential Vcath of the common power supply line 34 is so designed that the organic EL element 21 is kept at the cut-off state in this threshold correction period in order that current does not flow toward the organic EL element 21 but flows toward the holding capacitor 24 exclusively in the threshold correction period.

Figure 6A:
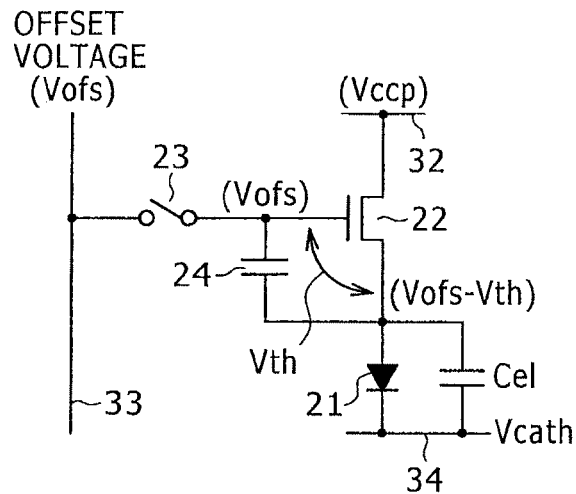
FIGS. 6A to 6D are explanatory diagrams of the circuit operation in the organic EL display according to the embodiment.

Subsequently, the potential WS of the scan line 31 is shifted to the lower potential side at time 4 so that the write transistor 23 enters the non-conductive state as shown in FIG. 6A. At this time, the gate electrode of the drive transistor 22 becomes the floating state. However, because the gate-source voltage Vgs is equal to the threshold voltage Vth of the drive transistor 22, the drive transistor 22 is in the cut-off state. Therefore, the drain-source current Ids does not flow to the drive transistor 22.

<Writing Period/Mobility Correction Period>

Figure 6B:
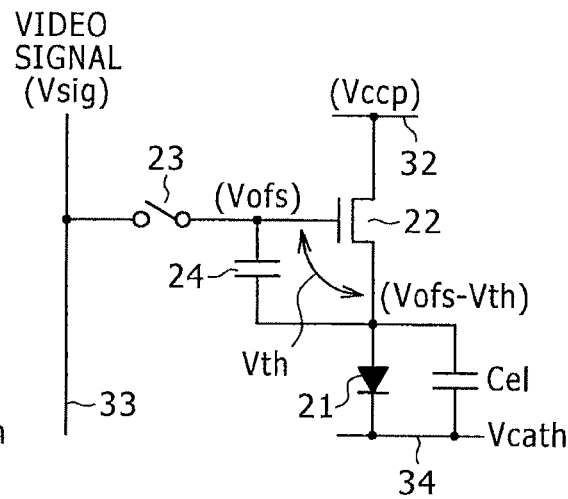
Figure 6C:
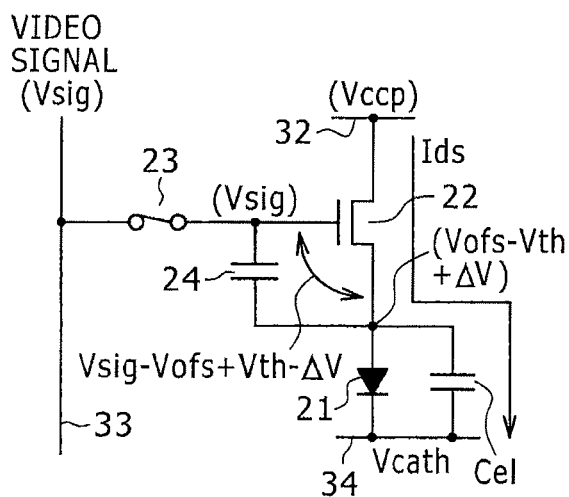

Subsequently, as shown in FIG. 6B, the potential of the signal line 33 is switched from the offset voltage Vofs to the signal voltage Vsig of the video signal at time t5. And then the potential WS of the scan line 31 is shifted to the higher potential side at time t6. Due to this operation, as shown in FIG. 6C, the write transistor 23 enters the conductive state to sample the signal voltage Vsig of the video signal and write the sampled voltage in the pixel 20.

Due to the writing of the signal voltage Vsig by the write transistor 23, the gate potential Vg of the drive transistor 22 becomes the signal voltage Vsig. In driving of the drive transistor 22 by the signal voltage Vsig of the video signal, the threshold voltage Vth of the drive transistor 22 and the voltage that is held in the holding capacitor 24 and is equivalent to the threshold voltage Vth cancel each other so that the threshold correction is carried out. The principle of the threshold correction will be described later.

At this time, the organic EL element 21 is initially in the cut-off state (high-impedance state). Therefore, the current (drain-source current Ids) supplied from the power supply line 32 through the drive transistor 22, depending on the signal voltage Vsig of the video signal, flows into the parasitic capacitor Cel of the organic EL element 21, and thus the charging of the parasitic capacitor Cel is started.

Due to the charging of this parasitic capacitor Cel, the source potential Vs of the drive transistor 22 rises up along with the elapse of time. At this time, variation in the threshold voltage Vth of the drive transistor 22 has been already corrected, and the drain-source current Ids of the drive transistor 22 depends on the mobility μ of the drive transistor 22.

In due course, the source potential Vs of the drive transistor 22 rises up to the potential Vofs−Vth+ΔV. At this time, the gate-source voltage Vgs of the drive transistor 22 is equal to Vsig−Vofs+Vth−ΔV. Specifically, the rise of the source potential Vs by the amount ΔV functions to subtract the potential ΔV from the voltage (Vsig−Vofs+Vth) held in the holding capacitor 24. In other words, this potential rise functions to discharge the electric charges in the holding capacitor 24, which is equivalent to negative feedback. Consequently, the rise amount ΔV of the source potential Vs is equivalent to the feedback amount of the negative feedback.

By thus carrying out the negative feedback of the drain-source current Ids flowing through the drive transistor 22 to the gate input of the drive transistor 22, i.e., to the gate-source voltage Vgs, mobility correction for cancelling the dependence of the drain-source current Ids of the drive transistor 22 on the mobility μ, i.e., for correcting variation in the mobility μ from pixel to pixel, is carried out.

More specifically, when the signal voltage Vsig of the video signal is higher, the drain-source current Ids is larger and thus the absolute value of the feedback amount (correction amount) ΔV of the negative feedback is also larger. Therefore, the mobility correction dependent upon the light-emission luminance level is carried out. Furthermore, when the signal voltage Vsig of the video signal is constant, because higher mobility μ of the drive transistor 22 provides a larger absolute value of the feedback amount ΔV of the negative feedback, variation in the mobility μ from pixel to pixel can be eliminated. The principle of the mobility correction will be described later.

<Light-Emission Period>

Figure 6D:
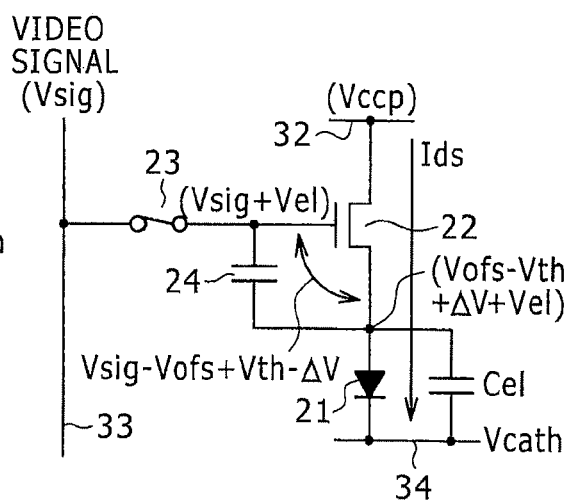

Subsequently, the potential WS of the scan line 31 is shifted to the lower potential side at time t7 so that the write transistor 23 enters the non-conductive state, as shown in FIG. 6D. This isolates the gate electrode of the drive transistor 22 from the signal line 33. Simultaneously, the drain-source current Ids starts flowing through the organic EL element 21, which raises the anode potential of the organic EL element 21 depending on the drain-source current Ids.

The rise of the anode potential of the organic EL element 21 is equivalent to the rise of the source potential Vs of the drive transistor 22. In linkage with the rise of the source potential Vs of the drive transistor 22, the gate potential Vg of the drive transistor 22 also rises up due to the bootstrap operation of the holding capacitor 24. The rise amount of the gate potential Vg is equal to that of the source potential Vs. Therefore, during the light-emission period, the gate-source voltage Vgs of the drive transistor 22 is kept constant at Vsig−Vofs+Vth−ΔV. At the time t8, the potential of the signal line 33 is switched from the signal voltage Vsig of the video signal to the offset voltage Vofs.

(Principle of Threshold Correction)

The principle of the threshold correction for the drive transistor 22 will be described below. The drive transistor 22 operates as a constant current source because it is so designed as to operate in the saturation region. Thus, the constant drain-source current (drive current) Ids represented by Equation (1) is supplied from the drive transistor 22 to the organic EL element 21.

$$Ids=(1/2) \cdot \mu(W/L)Cox(Vgs-Vth)^2 \qquad (1)$$

In Equation (1), W denotes the channel width of the drive transistor 22, L denotes the channel length thereof, and Cox denotes the gate capacitance per unit area.

Figure 7:
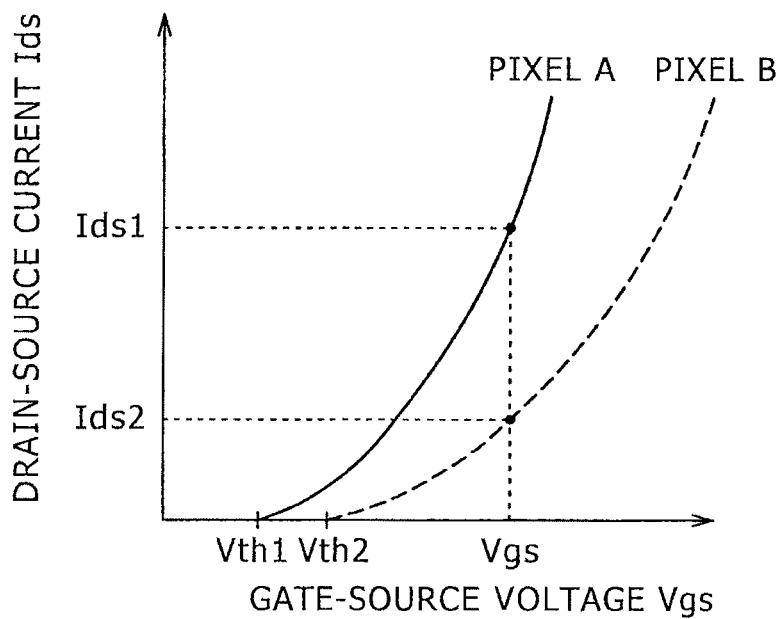
FIG. 7 is a characteristic diagram for explaining a problem due to variation in threshold voltage Vth of a drive transistor.

FIG. 7 shows the characteristic of the drain-source current Ids vs. the gate-source voltage Vgs of the drive transistor 22. As shown in this characteristic diagram, unless correction against variation in the threshold voltage Vth of the drive transistor 22 is carried out, the same voltage Vgs provides the different drain source currents Ids. Specifically, when the threshold voltage Vth is Vth1, the drain-source current Ids corresponding to the gate-source voltage Vgs is Ids1. On the other hand, when the threshold voltage Vth is Vth2 (Vth2>Vth1), the drain-source current Ids corresponding to the same gate-source voltage Vgs is Ids2 (Ids2<Ids1). That is, if there is variation in the threshold voltage Vth of the drive transistor 22, the drain-source current Ids varies even when the gate-source voltage Vgs is constant.

In contrast, in the pixel (pixel circuit) 20 having the above-described configuration, the gate-source voltage Vgs of the drive transistor 22 in the light-emission state is Vsig−Vofs+Vth−ΔV, as described above. Therefore, the drain-source current Ids is represented by Equation (2), which is obtained by substituting this voltage for Vgs in Equation (1).

$$Ids=(1/2) \cdot \mu(W/L)Cox(Vsig-Vofs-\Delta V)^2 \qquad (2)$$

That is, the term of the threshold voltage Vth of the drive transistor 22 is cancelled, and thus the drain-source current Ids supplied from the drive transistor 22 to the organic EL element 21 does not depend on the threshold voltage Vth of the drive transistor 22. As a result, even when the threshold voltage Vth of the drive transistor 22 varies from pixel to pixel due to variation in the manufacturing process for the drive transistor 22 and changes in the drive transistor 22 over time, the drain-source current Ids will not vary and hence the light-emission luminance of the organic EL element 21 will also not vary.

(Principle of Mobility Correction)

Figure 8:
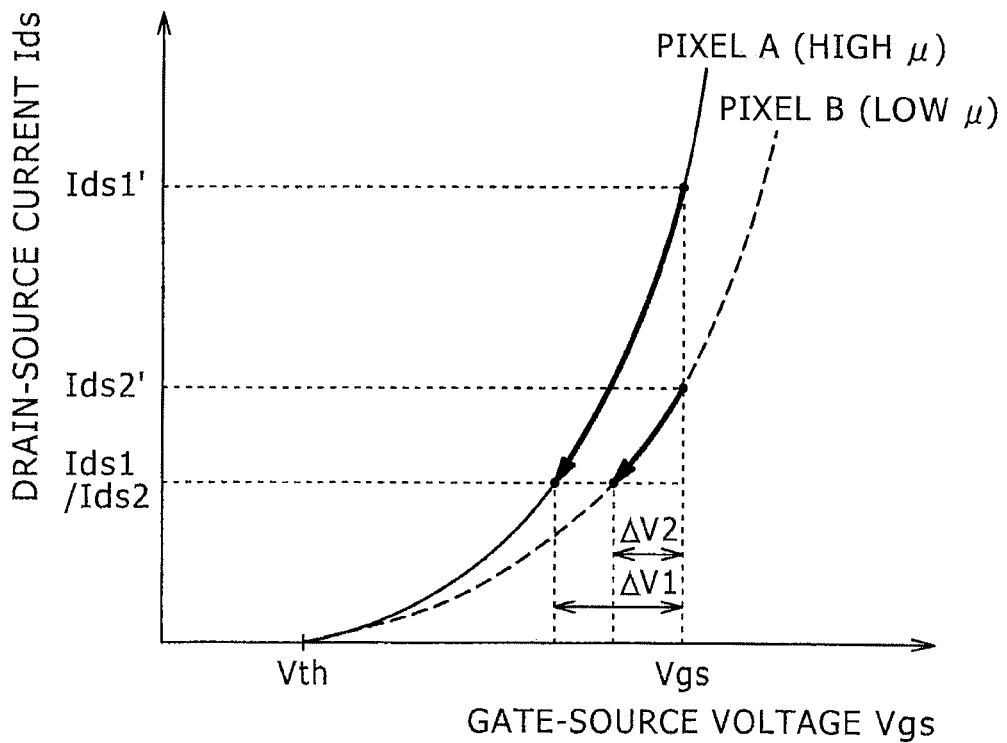
FIG. 8 is a characteristic diagram for explaining a problem due to variation in mobility μ of the drive transistor.

The principle of the mobility correction for the drive transistor 22 will be described below. FIG. 8 shows characteristic curves for comparison between a pixel A in which the mobility μ of the drive transistor 22 is relatively high and a pixel B in which the mobility μ of the drive transistor 22 is relatively low. If the drive transistor 22 is formed of a poly-silicon thin film transistor or the like, it is inevitable that the mobility μ varies from pixel to pixel like the mobility difference between the pixel A and the pixel B.

If the input signal voltage Vsig of the same level is written to both the pixels A and B, for example, in the state in which the mobility μ is different between the pixel A and the pixel B, no correction of the mobility μ yields large a difference between the drain-source current Ids1' flowing through the pixel A in which the mobility μ is high and the drain-source current Ids2' flowing through the pixel B in which the mobility μ is low. The occurrence of such a large difference in the drain-source current Ids between pixels attributed to variation in the mobility μ will lower the uniformity of the screen.

As is apparent from the above-described transistor characteristic equation (1), higher mobility μ provides larger drain-source current Ids. Therefore, the higher the mobility μ is, the larger the feedback amount ΔV of the negative feedback is. As shown in FIG. 8, the feedback amount ΔV1 of the pixel A having high mobility μ is larger than the feedback amount ΔV2 of the pixel B having low mobility μ. Thus, by carrying out negative feedback of the drain-source current Ids of the drive transistor 22 to the input signal voltage Vsig by the mobility correction operation, variation in the mobility μ can be suppressed because higher mobility μ provides a higher degree of the negative feedback.

Specifically, due to the correction by the feedback amount ΔV1 for the pixel A having high mobility μ, the drain-source current Ids therein is greatly decreased from Ids1' to Ids1. On the other hand, because the feedback amount ΔV2 of the pixel B having low mobility μ is small, the decrease in the drain-source current Ids therein is not so large: from Ids2' to Ids2. As a result, the drain-source current Ids' of the pixel A and the drain-source current Ids2 of the pixel B become almost equal to each other so that the variation in the mobility μ is corrected.

Summarizing the above, when pixel A and pixel B have different mobility μ, the feedback amount ΔV1 of the pixel A having high mobility μ is larger than the feedback amount ΔV2 of the pixel B having low mobility μ. That is, in a pixel with higher mobility μ, the feedback amount ΔV is larger and thus the decrease amount of the drain-source current Ids is larger. Consequently, through the negative feedback of the drain-source current Ids of the drive transistor 22 to the input signal voltage Vsig, the current values of the drain-source currents Ids in pixels having different mobility μ are equalized. As a result, the variation in the mobility μ can be corrected.

With use of FIGS. 9A to 9C, a description will be made below about the relationships between the signal potential (sampling potential) Vsig of the video signal and the drain-source current Ids of the drive transistor 22 in the pixel (pixel circuit) 20 shown in FIG. 2, in association with the presence/absence of the threshold correction and the mobility correction.

Figure 9A:
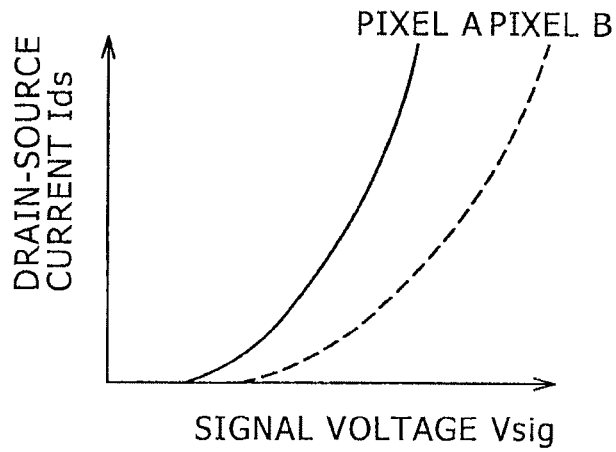
FIGS. 9A to 9C are characteristic diagrams for explaining the relationship between signal voltage Vsig of a video signal and drain-source current Ids of the drive transistor in association with the presence/absence of threshold correction and mobility correction.

FIG. 9A shows the case in which neither the threshold correction nor the mobility correction is carried out. FIG. 9B shows the case in which the mobility correction is not carried out, but the threshold correction is carried out. FIG. 9C shows the case in which both the threshold correction and the mobility correction are carried out. As shown in FIG. 9A, if neither the threshold correction nor the mobility correction is carried out, a large difference in the drain-source current Ids arises between the pixels A and B attributed to variation in the threshold voltage Vth and the mobility μ between the pixels A and B.

Figure 9B:
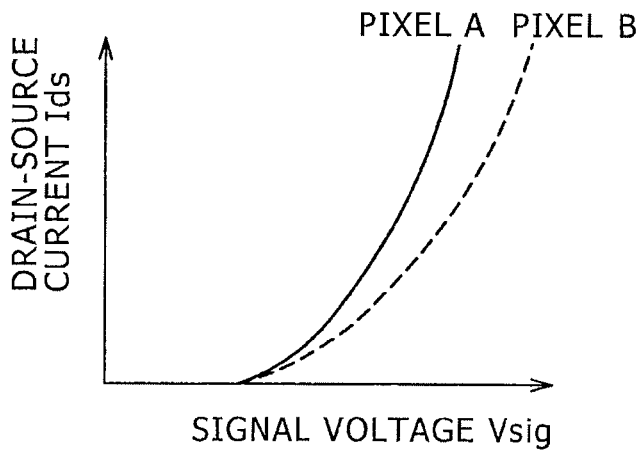

In contrast, if only the threshold correction is carried out, variation in the drain-source current Ids can be decreased to some extent by the threshold correction, as shown in FIG. 9B. However, difference in the drain-source current Ids between the pixels A and B still remains attributed to variation in the mobility μ between the pixels A and B.

Figure 9C:
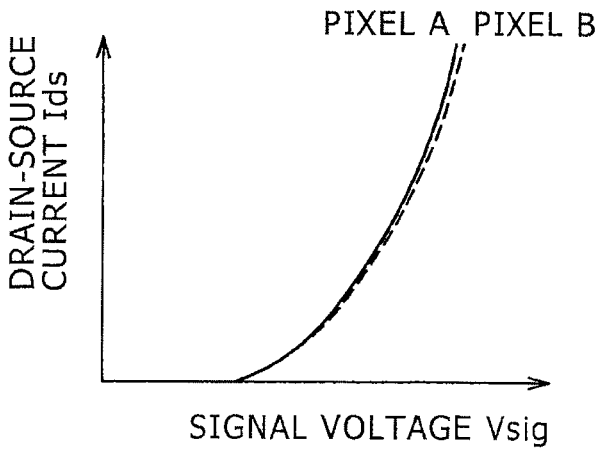

If both the threshold correction and the mobility correction are carried out, as shown in FIG. 9C, the difference in the drain-source current Ids between the pixels A and B attributed to variation in the threshold voltage Vth and the mobility μ between the pixels A and B can be substantially eliminated. Thus, variation in the luminance of the organic EL element 21 does not arise at any grayscale, which can provide a display having a favorable image quality.

Advantageous Effects of Present Embodiment (Problem in Bootstrap Operation)

A problem in the bootstrap operation will be described below with use of FIG. 10, which shows an equivalent circuit of the pixel 20.

Figure 10:
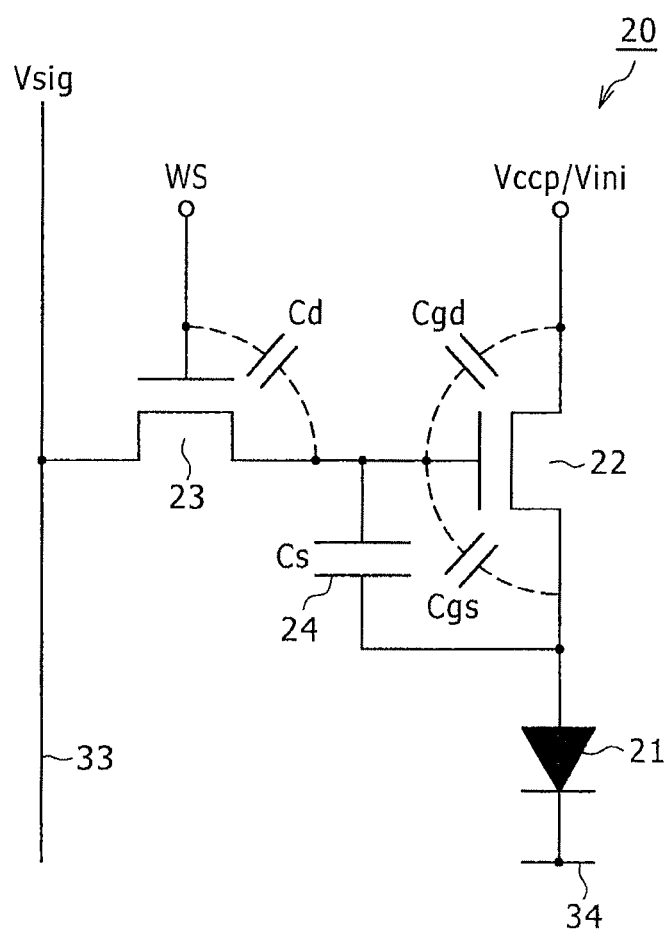
FIG. 10 is an equivalent circuit diagram of the pixel.

In FIG. 10, Cs denotes the capacitance of the holding capacitor 24, Cgs denotes the capacitance of the parasitic capacitor between the gate and source of the drive transistor 22, Cgd denotes the capacitance of the parasitic capacitor between the gate and drain of the drive transistor 22, and Cd denotes the capacitance of the parasitic capacitor between the gate and drain/source of the write transistor 23. If the rise amount of the source potential Vs of the drive transistor 22 is represented as $\Delta Vs$ and the rise amount of the gate potential Vg thereof is represented as $\Delta Vg$, the ratio of the rise amount $\Delta Vg$ of the gate potential Vg of the drive transistor to the rise amount $\Delta Vs$ of the source potential Vs thereof, i.e., the bootstrap ratio Gbst, is represented by Equation (3).

$$Gbst = \Delta Vg/\Delta Vs = \{(Cs+Cgs)/(Cs+Cgs+Cgd+Cd)\} \quad (3)$$

In the bootstrap operation, if the bootstrap ratio Gbst is low, the rise amount $\Delta Vg$ of the gate potential Vg is small with respect to the rise amount $\Delta Vs$ of the source potential Vs, and thus the gate-source voltage Vgs is reduced and becomes lower than the voltage corresponding to the signal voltage Vsig held in the holding capacitor 24 through writing by the write transistor 23.

This leads to failure in the ensuring of the current necessary as the drive current Ids, to be applied to the organic EL element 21, i.e., the current corresponding to the signal voltage Vsig of the video signal written by the write transistor 23, which results in luminance lowering. Thus, luminance unevenness occurs, which causes the deterioration of the image quality.

As is apparent from Equation (3), the bootstrap ratio Gbst is determined by the capacitance Cs of the holding capacitor 24 and the parasitic capacitances Cgs, Cgd, and Cd attaching to the gate of the drive transistor 22. The higher these capacitances Cs, Cgs, Cgd, and Cd are, the higher the bootstrap ratio Gbst is.

Feature of Present Embodiment

A feature of the present embodiment is that the capacitance Cs of the holding capacitor 24 is increased without increasing the area of the electrodes of the holding capacitor 24, i.e., the size of the holding capacitor 24, for the above-described reason (the reason described in Description of The Related Art), to thereby design a high bootstrap ratio Gbst under the condition of the limited pixel size for enhanced image quality.

Specifically, in the present embodiment for the holding capacitor 24, a first electrode composed of a metal is interposed between second and third electrodes each composed of a metal in such a way that the second and third electrodes face the respective surfaces of the first electrode. Thereby, a first capacitor 24-1 is formed between the first and second electrodes, and a second capacitor 24-2 is formed between the first and third electrodes. These first and second capacitors 24-1 and 24-2 are connected in parallel to each other electrically.

Figure 11:
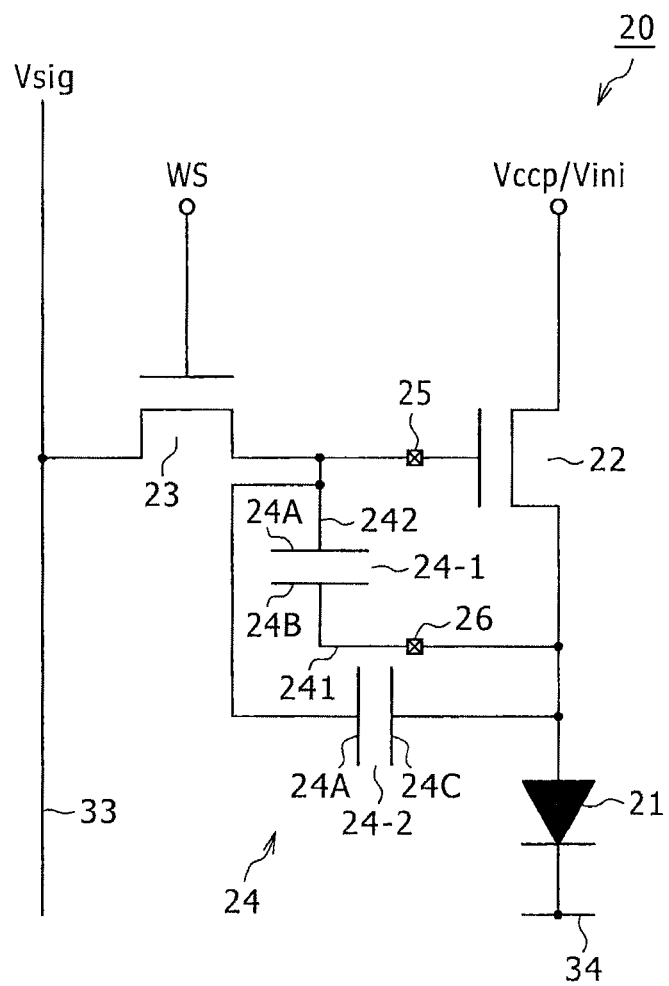
FIG. 11 is a circuit diagram showing the connection relationship among the respective circuit elements in a pixel, including the electric connection of a holding capacitor.

FIG. 11 is a circuit diagram showing the connection relationship among the respective circuit elements in the pixel 20, including the electric connection of the holding capacitor 24 (first and second capacitors 24-1 and 24-2). In FIG. 11, the same part as that in FIG. 2 is given the same numeral.

Referring to FIG. 11, the holding capacitor 24 is composed of the first capacitor 24-1 formed between a first electrode 24A and a second electrode 24B disposed to face one surface of the electrode 24A, and the second capacitor 24-2 formed between the first electrode 24A and a third electrode 24C disposed to face the other surface of the electrode 24A. These first and second capacitors 24-1 and 24-2 are connected in parallel to each other electrically.

Figure 12:
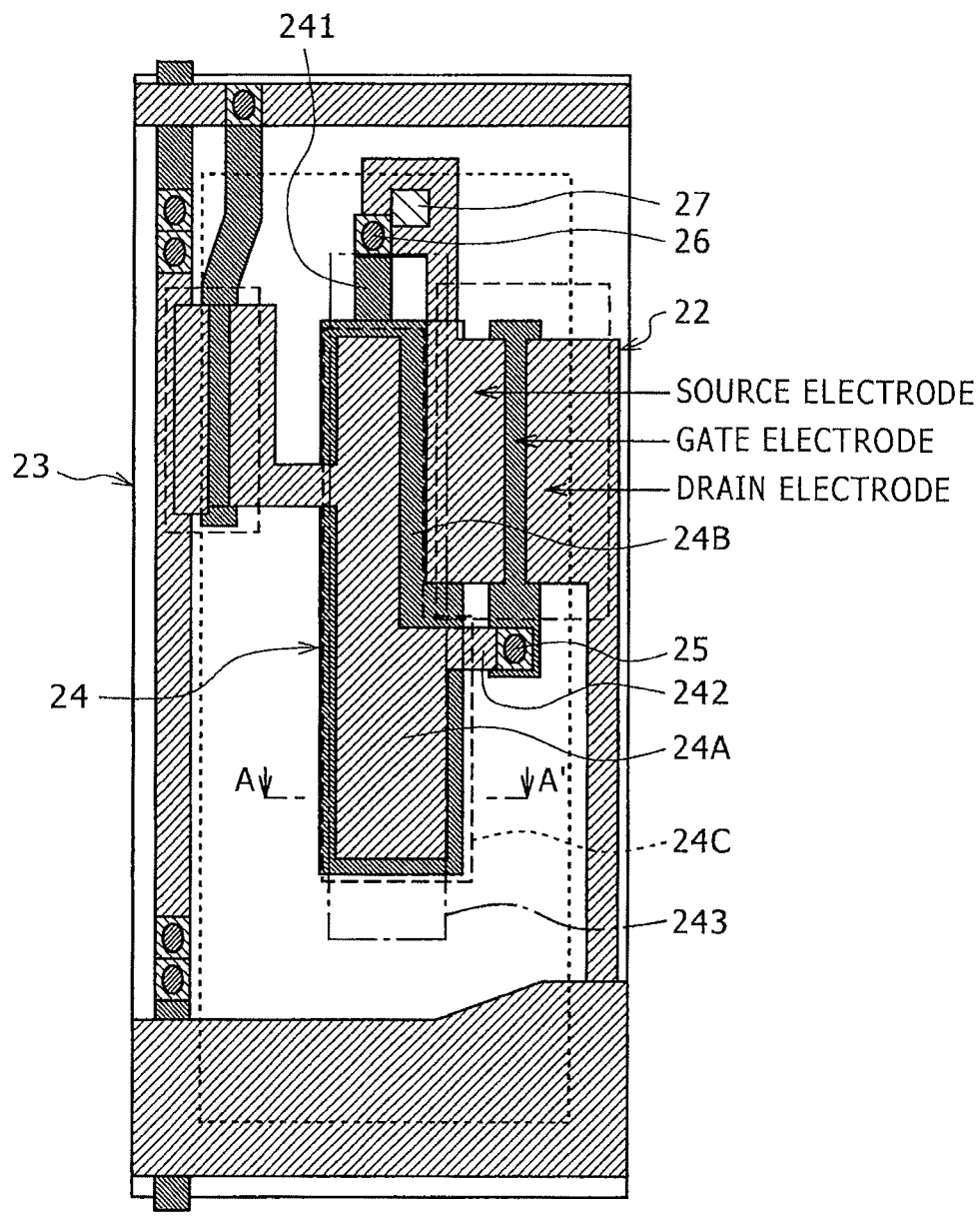
FIG. 12 is a planar pattern diagram showing the structure of interconnect layers in the pixel according to the embodiment.

FIG. 12 is a planar pattern diagram showing the structure of interconnect layers in the pixel 20. Referring to FIGS. 11 and 12, the second electrode 24B and an interconnect 241 thereof are formed of a first metal layer, which is the same as the layer of the gate electrode of the drive transistor 22. The first electrode 24A and an interconnect 242 thereof are formed of a second metal layer, which is the same as the layer of the source electrode of the drive transistor 22 and the other electrode (drain electrode/source electrode) of the write transistor 23. The third electrode 24C is formed of a third metal layer, which is the same as the layer of the anode electrode of the organic EL element 21.

The interconnect 242 of the first electrode 24A is connected to the gate electrode of the drive transistor 22 via a contact 25 for electrically connecting the first metal layer to the second metal layer. The interconnect 241 of the second electrode 24B is connected to the source electrode of the drive transistor 22 via a contact 26 for electrically connecting the first metal layer to the second metal layer. The source electrode of the drive transistor 22 in the second metal layer is electrically connected to the anode electrode of the organic EL element 21 in the third metal layer via a contact 27.

As is apparent from this electric connection relationship, the holding capacitor 24 is formed by using the first electrode 24A formed of the second metal layer at the same potential as that of the gate electrode of the drive transistor 22, the second electrode 24B formed of the first metal layer at the same potential as that of the source electrode of the drive transistor 22, and the third electrode 24C formed of the third metal layer at the same potential as that of the source electrode of the drive transistor 22.

The second electrode 24B of the holding capacitor 24 and the gate electrode of the drive transistor 22 are at different potentials, although both are formed of the first metal layer. Furthermore, the first electrode 24A of the holding capacitor 24 and the source electrode of the drive transistor 22 are at different potentials, although both are formed of the second metal layer.

Advantageous Effects of Present Embodiment

By thus forming the first and second capacitors 24-1 and 24-2 by using the first, second, and third electrodes 24A, 24B, and 24C and connecting these first and second capacitors 24-1 and 24-2 in parallel to each other electrically, the capacitance Cs of the holding capacitor 24 can be increased (can be doubled, in principle) compared with the holding capacitor 24 formed by using two electrodes, without increasing the size of the holding capacitor 24, if the distances among three electrodes 24A, 24B, and 24C are equalized to each other. This allows designing of a high bootstrap ratio Gbst under the condition of the limited pixel size.

Because the bootstrap ratio Gbst can be set high, and ideally can be set to one, when the source potential Vs of the drive transistor 22 rises up, the rise amount ΔVg of the gate potential Vg is substantially equal to the rise amount ΔVs of the source potential Vs in bootstrap operation, and thus the gate-source voltage Vgs is not reduced. This allows ensuring of the current necessary as the drive current Ids to be applied to the organic EL element 21.

This feature can eliminate luminance lowering and accompanying luminance unevenness that occur unless the drive current Ids corresponding to the signal voltage Vsig of the video signal written by the write transistor 23 can be ensured, without originally designing a large current as the drive current to be applied to the organic EL element 21 in anticipation of the voltage decrease corresponding to the bootstrap ratio Gbst. Thus, the image quality can be enhanced without an increase in the power consumption.

In the case of the organic EL display 10 employing the pixel configuration shown in FIG. 2, the transistor connected to the drive transistor 22 is only the write transistor 23. Therefore, the number of transistors connected to the drive transistor 22 is smaller compared with the organic EL display described in Patent document 1 (Japanese Patent Laid-Open No. 2006-133542) and so on. Thus, the parasitic capacitance attaching to the gate electrode of the drive transistor 22 is correspondingly lower, and hence the bootstrap ratio Gbst tends to be low. Consequently, the technique for increasing the capacitance Cs of the holding capacitor 24 without increasing the size of the holding capacitor 24 is particularly effective for the organic EL display 10 employing the pixel configuration shown in FIG. 2.

Other Advantageous Effects of Present Embodiment

Even if there is no need to increase the capacitance Cs of the holding capacitor 24, by forming the first and second capacitors 24-1 and 24-2 by using three electrodes 24A, 24B, and 24C and connecting these first and second capacitors 24-1 and 24-2 in parallel to each other electrically, the area of the electrodes of the holding capacitor 24 can be reduced compared with the holding capacitor 24 formed by using two electrodes, if the distances among three electrodes 24A, 24B, and 24C are equalized to each other. In principle, the area can be reduced to the half.

The feature that the area of the electrodes of the holding capacitor 24 can be reduced is equivalent to the feature that the size of the holding capacitor 24 can be decreased, and therefore can contribute to miniaturization of the pixel 20. Furthermore, if the area of the electrodes of the holding capacitor 24 is reduced while the pixel size is kept as it is without the miniaturization of the pixel 20, the ratio of the area of the electrodes of the holding capacitor 24 to the total area of the pixel 20 is decreased. Thus, even when a metal dust or the like enters the pixel 20 in the manufacturing process, for example, it is possible to suppress the occurrence of the short-circuit between the electrode of the holding capacitor 24 and another metal interconnect due to the metal dust or the like and hence a fault in the pixel 20, which can enhance the yield.

Working Example

Figure 13:
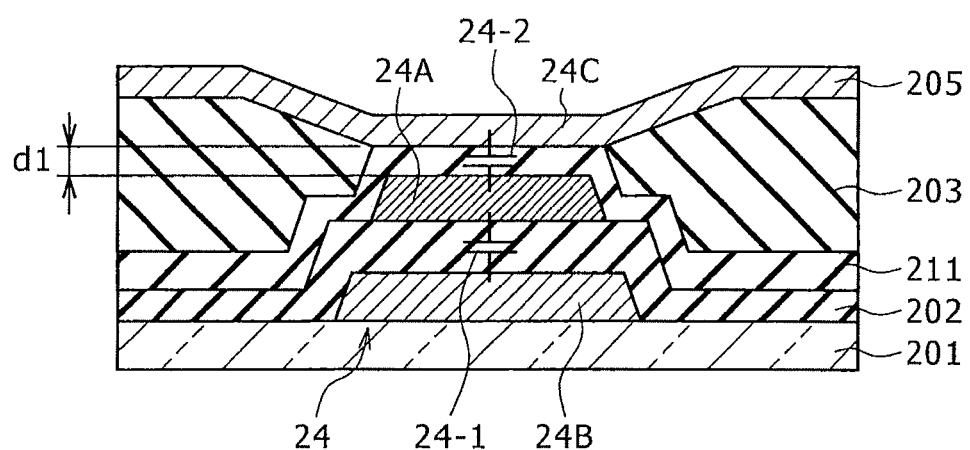
FIG. 13 is a sectional view showing the structure of a holding capacitor according to one working example of the present invention.

A specific working example will be described below. FIG. 13 is a sectional view along line A-A' in FIG. 12, showing the structure of the holding capacitor 24 according to one working example of the present invention. In FIG. 13, the same part as that in FIG. 3 is given the same numeral.

As shown in FIG. 13, the holding capacitor 24 is formed by using the second electrode 24B, the first electrode 24A, and the anode electrode 205 of the organic EL element 21. The second electrode 24B is formed of a pattern of the first metal layer on a transparent insulating substrate such as a glass substrate 201. The first electrode 24A is formed of a pattern of the second metal layer disposed over the second electrode 24B with the intermediary of an insulating film 202. The anode electrode 205 is formed of a pattern of the third metal layer disposed over the first electrode 24A with the intermediary of an insulating protective film 211.

Of the anode electrode 205 of the organic EL element 21, the partial portion (area) opposed to the first electrode 24A serves as the third electrode 24C. The first capacitor 24-1 is formed between the second electrode 24B and the first electrode 24A, and the second capacitor 24-2 is formed between the first electrode 24A and the third electrode 24C. As described above, these first and second capacitors 24-1 and 24-2 are connected in parallel to each other electrically so as to form the holding capacitor 24.

A feature of the present working example is that an insulating planarization film 203, which is originally provided between the insulating protective film 211 and the third metal layer, is partially removed from the area through which the first electrode 24A faces the third electrode 24C (area 243 surrounded by the dashed-dotted line in FIG. 12).

For this partial removal of the insulating planarization film 203, the patterning mask for forming the pattern of the insulating planarization film 203 is so fabricated as to have a pattern for providing an aperture corresponding to the area of the holding capacitor 24. This allows the insulating planarization film 203 to be removed from the area through which the first electrode 24A faces the third electrode 24C in the forming of the pattern of the insulating planarization film 203, without an increase in the number of steps.

By thus removing the insulating planarization film 203 from the area through which the first electrode 24A faces the third electrode 24C, the distance d1 between both the electrodes 24A and 24C can be decreased to the value equivalent to the film thickness of the insulating protective film 211. As is well known, the capacitance is in proportion to the area of two electrodes and is inversely proportional to the distance between two electrodes.

Therefore, due to the decreasing of the distance d1 between the first and third electrodes 24A and 24C, the capacitance of the second capacitor 24-2 formed between these electrodes 24A and 24C can be increased to almost the same capacitance as that of the first capacitor 24-1 formed between the first and second electrodes 24A and 24B, unlike the case in which the insulating planarization film 203, which generally has a thickness several times that of the insulating protective film 211, exists between the electrodes 24A and 24C.

Figure 14:
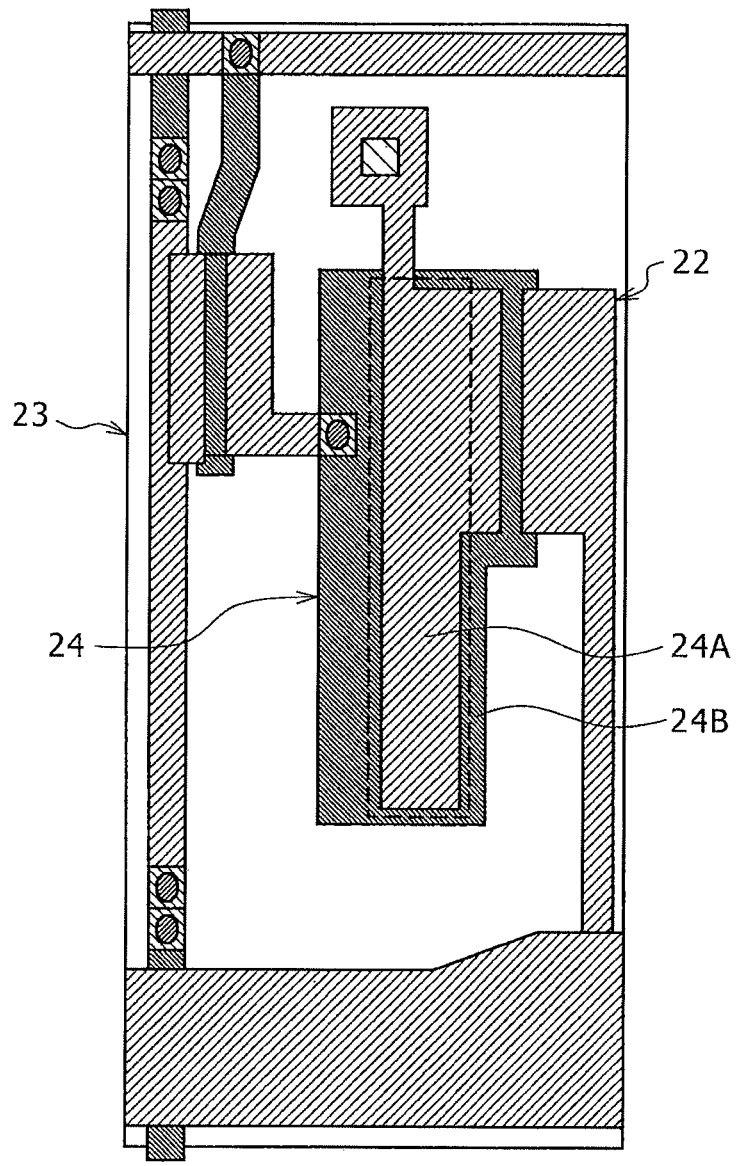
FIG. 14 is a planar pattern diagram showing the structure of interconnect layers in a pixel according to related art.

The present working example will be compared with related art shown in FIG. 14, in which the holding capacitor 24 is formed by using the first electrode 24A of the second metal layer and the partial portion of the first metal layer opposed to the first electrode 24A (second electrode 24B). This comparison is based on an assumption that the area of the first electrode 24A shown in FIG. 12 is equal to that of the first electrode 24A shown in FIG. 14.

According to this comparison, the present working example is allowed to ensure the capacitance about twice that in the related art shown in FIG. 14 as the capacitance Cs of the holding capacitor 24, because the second capacitor 24-2 formed between the first and third electrodes 24A and 24C can be increased to almost the same capacitance as that of the first capacitor 24-1 formed between the first and second electrodes 24A and 24B by removing the insulating planarization film 203 from the area through which the first electrode 24A faces the third electrode 24C.

(Method for Manufacturing Holding Capacitor)

Figure 15:
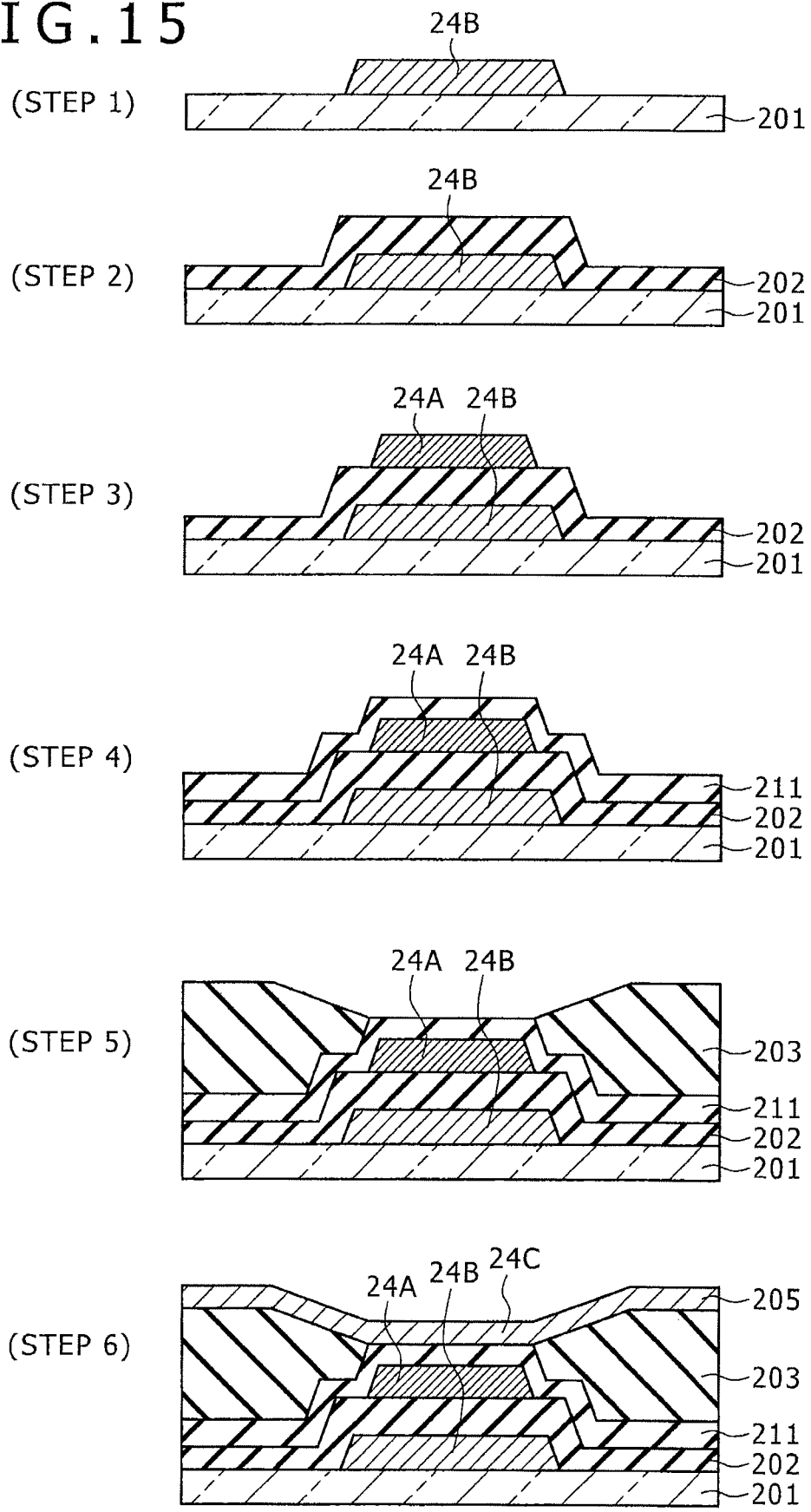
FIG. 15 is a step diagram showing a method for manufacturing the holding capacitor according to one working example of the present invention.

A method for manufacturing the holding capacitor 24 according to the present working example will be described below with use of the step diagram shown in FIG. 15. In FIG. 15, the same part as that in FIG. 13 is given the same numeral.

Initially, the second electrode 24B is formed as a pattern of the first metal layer on a transparent insulating substrate such as the glass substrate 201 (Step 1), and then the insulating film 202 is formed to cover the second electrode 24B (Step 2). Subsequently, the first electrode 24A is formed as a pattern of the second metal layer (Step 3), and then the insulating protective film 211 is formed to cover the first electrode 24A (Step 4).

Subsequently, the insulating planarization film 203 is formed as a pattern by fabricating a patterning mask by photoresist. The patterning mask is so fabricated that the mask is formed also on the area opposed to the first electrode 24A so that the insulating planarization film 203 is formed as the pattern (Step 5). By thus forming the insulating planarization film 203 as the pattern, the partial portion of the insulating planarization film 203 opposed to the first electrode 24A can be removed simultaneously with the step of forming the insulating planarization film 203.

Subsequently, the anode electrode 205 of the organic EL element 21 is formed as a pattern of the third metal layer (Step 6). At this time, because the partial portion of the insulating planarization film 203 opposed to the first electrode 24A is removed, the anode electrode 205 is formed on the insulating protective film 211 in this removed part. The partial portion of the anode electrode 205 under which the insulating planarization film 203 is removed serves as the third electrode 24C.

As described above, in the step of forming the insulating planarization film 203 (Step 5), the insulating planarization film 203 is removed from the area between the first electrode 24A and the third electrode 24C. Thus, the distance d1 between the first electrode 24A and the third electrode 24C can be set small which can increase the capacitance of the second capacitor 24-2 formed between the electrodes 24A and 24C without an increase in the number of steps.

Other Working Examples

Figure 16:
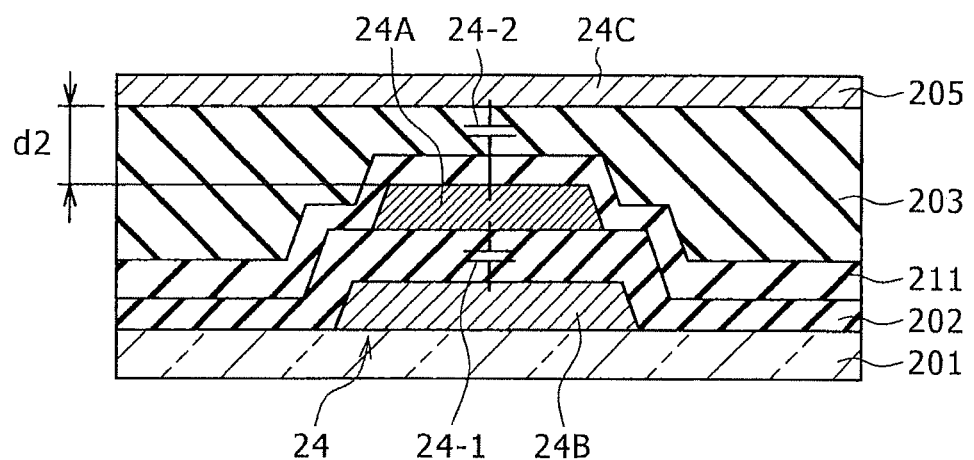
FIG. 16 is a sectional view showing the structure of a holding capacitor according to another working example of the present invention.

In the above-described working example, the insulating planarization film 203 is removed from the area through which the first electrode 24A faces the third electrode 24C, as a preferred mode of the embodiment. However, as shown in FIG. 16, the insulating planarization film 203 does not necessarily need to be removed from this area. Even in the case of FIG. 16, the second capacitor 24-2 having the capacitance corresponding to the distance d2, which is equivalent to the sum of the film thickness of the insulating planarization film 203 and the film thickness of the insulating protective film 211, can be formed between the first electrode 24A and the third electrode 24C.

Furthermore, by making an electric connection in such a way that the second capacitor 24-2 is connected in parallel to the first capacitor 24-1, as described above, the capacitance Cs of the holding capacitor 24 arising from the parallel connection between the first capacitor 24-1 and the second capacitor 24-2 can be increased corresponding to the existence of the second capacitor 24-2.

Modification Examples

In the above-described embodiment, as an example, its feature is applied to the organic EL display 10 having the pixel circuit 20 with the circuit configuration that includes the drive transistor 22 for driving the organic EL element 21, the write transistor 23 for sampling the signal voltage Vsig of the video signal and writing it in the pixel, and the holding capacitor 24 that is connected between the gate and source of the drive transistor 22 and holds the signal voltage Vsig written by the write transistor 23. However, the present invention is not limited to this application example.

The embodiment can be similarly applied also to organic EL displays having any of the following pixel circuits: a pixel circuit having a switching transistor that is connected between the drive transistor 22 and a power supply line and operates to selectively supply drive current from the power supply line to the drive transistor 22; and a pixel circuit further having a switching transistor that enters the conductive state timely to thereby operate to detect the threshold voltage Vth of the drive transistor 22 and hold the detected threshold voltage Vth in the holding capacitor 24 before driving of the organic EL element 21 by current.

Moreover, in the above-described embodiment, the drive scheme is applied to an organic EL display that employs an organic EL element as an electro-optical element in the pixel circuit 20, as an example. However, the embodiment is not limited to this application example but can be applied to overall displays that employ a current-driven electro-optical element (light-emitting element) whose light-emission luminance varies depending on the value of the current flowing through the element.

Application Examples

The display according to the above-described embodiment can be applied to various kinds of electronic apparatus shown in FIGS. 17 to 21 as one example. Specifically, it can be used as a display in electronic apparatus in any field that displays, as an image or video, a video signal input thereto or a video signal produced therein, such as a digital camera, notebook personal computer, portable terminal apparatus typified by a cellular phone, and video camera.

Using the display according to the embodiment as a display in electronic apparatus in any field offers an advantage that images having high quality can be displayed at low power consumption in various kinds of electronic apparatus, because the display according to the embodiment is allowed to have enhanced image quality without an increase in the power consumption through designing of a high bootstrap ratio under the condition of the limited pixel size, as is apparent from the description of the above embodiment.

The display according to the embodiment encompasses also a module-shape display with a sealed structure. Examples of such a display include a display module formed by attaching a counterpart composed of transparent glass or the like to the pixel array part 30. This transparent counterpart may be provided with a color filter, protective film, light-shielding film, and so on. The display module may be provided with a circuit part, flexible printed circuit (FPC), and so on for input/output of signals and so forth to/from the pixel array part from/to the external.

Examples of electronic apparatus to which the embodiment is applied will be described below.

Figure 17:
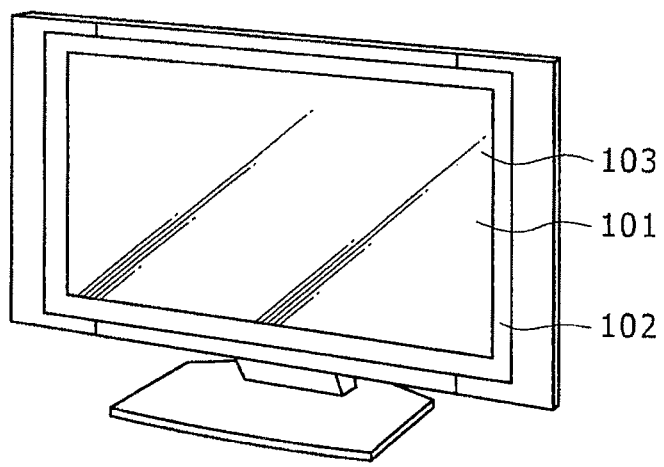
FIG. 17 is a perspective view showing a television to which the embodiment is applied.

FIG. 17 is a perspective view showing a television to which the embodiment is applied. This television includes a video display screen 101 composed of a front panel 102, a filter glass 103, and so on, and is fabricated by using the display according to the embodiment as the video display screen 101.

Figure 18A:
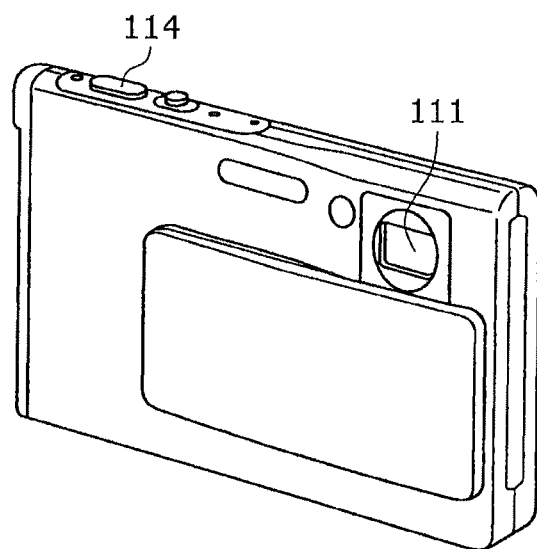
FIGS. 18A and 18B are perspective views showing a digital camera to which the embodiment is applied.
Figure 18B:
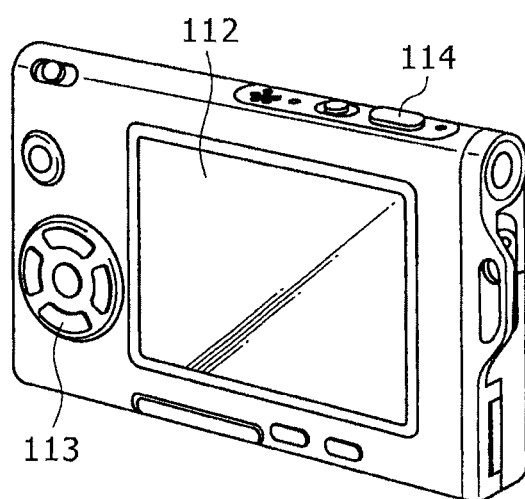

FIGS. 18A and 18B are perspective views showing a digital camera to which the embodiment is applied: FIG. 18A is a front-side view and FIG. 18B is a rear-side view. This digital camera includes a light emitter 111 for flash, a display part 112, a menu switch 113, a shutter button 114, and so on, and is fabricated by using the display according to the embodiment as the display part 112.

Figure 19:
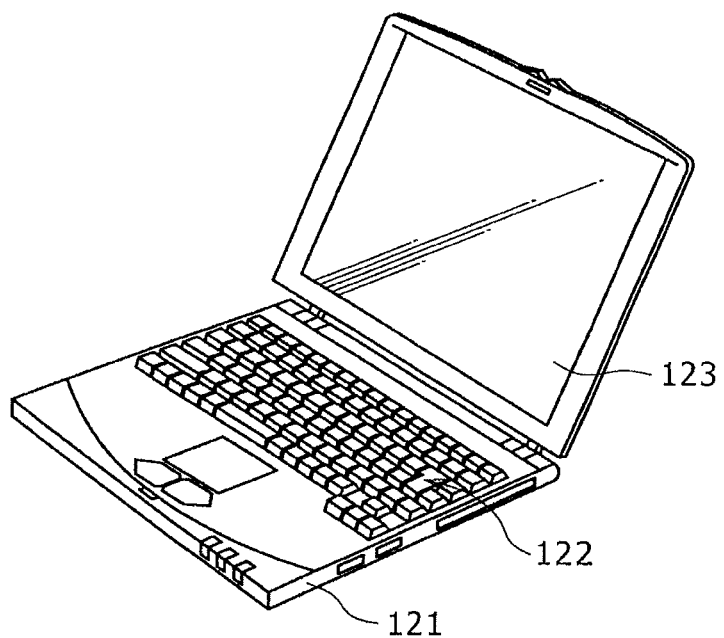
FIG. 19 is a perspective view showing a notebook personal computer to which the embodiment is applied.

FIG. 19 is a perspective view showing a notebook personal computer to which the embodiment is applied. This notebook personal computer includes in its main body 121 a keyboard 122 operated in inputting of characters and so forth, a display part 123 for displaying images, and so on. The notebook personal computer is fabricated by using the display according to the embodiment as the display part 123.

Figure 20:
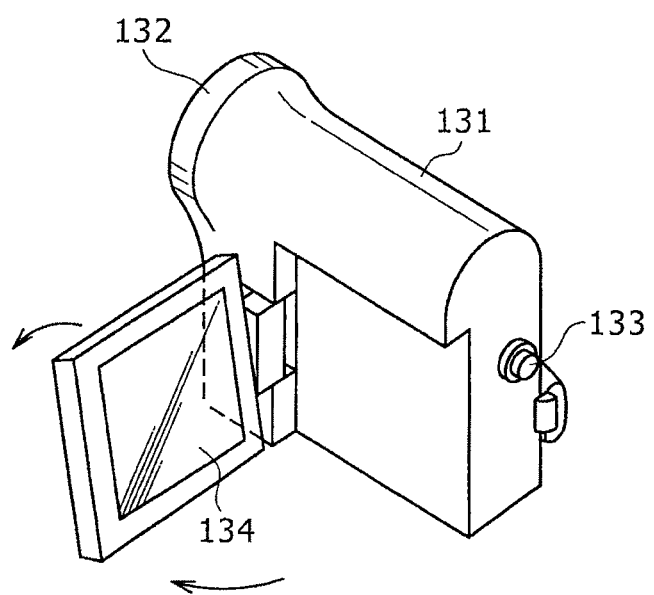
FIG. 20 is a perspective view showing a video camera to which the embodiment is applied.

FIG. 20 is a perspective view showing a video camera to which the embodiment is applied. This video camera includes a main body 131, a lens 132 that is disposed on the front side of the camera and used to capture a subject image, a start/stop switch 133 for imaging operation, a display part 134, and so on. The video camera is fabricated by using the display according to the embodiment as the display part 134.

FIGS. 21A to 21G are perspective views showing a cellular phone as an example of portable terminal apparatus to which the embodiment is applied: FIGS. 21A and 21B are a front view and side view, respectively, of the opened state, and FIGS. 21C to 21G are a front view, left-side view, right-side view, top view, and bottom view, respectively, of the closed state. This cellular phone includes an upper casing 141, a lower casing 142, a connection (hinge) 143, a display 144, a sub-display 145, a picture light 146, a camera 147, and so on. The cellular phone is fabricated by using the display according to the embodiment as the display 144 and the sub-display 145.

It should be understood by those skilled in the art that various modifications, combinations, sub-combinations and alterations may occur depending on design requirements and other factor in so far as they are within the scope of the appended claims or the equivalents thereof.

The invention claimed is:

1. A self-luminous display device comprising:
a substrate;
a pixel array including a plurality of pixels arranged in a matrix on the substrate, respective ones of the plurality of pixels comprising a write transistor configured to write a video signal, a drive transistor configured to control a current based on the video signal, a holding capacitor configured to store a voltage dependent on the video signal, and a light emitting element configured to emit light in response to the current, wherein
the holding capacitor includes:
a first electrode that is a first portion of a first electrode layer,
a second electrode that is a first portion of a second electrode layer, and disposed below the first electrode,
a first insulating layer interposed between the first electrode and the second electrode,
a third electrode that is a first portion of a third electrode layer, and disposed above the first electrode, and
a second insulating layer interposed between the first electrode and the third electrode,
the light emitting element includes an anode electrode that is a second portion of the third electrode layer, a cathode electrode, and a light emitting layer disposed between the anode electrode and the cathode electrode,
a source or drain electrode of the write transistor is a second portion of the first electrode layer, and the source or drain electrode of the write transistor and the second electrode are continuously formed as a single film,
the second electrode is directly connected to a gate electrode of the driving transistor via a first contact hole,
a planarization layer is disposed between the second insulating layer and the anode electrode,
the planarization layer has an opening region on the first electrode, and
the third electrode is disposed within the opening region.

2. The self-luminous display device according to claim 1, wherein the third electrode is disposed directly on the second insulating layer.

3. The self-luminous display device according to claim 1, wherein a majority of the opening region overlaps with the first electrode from a plan view perspective.

4. The self-luminous display device according to claim 1 wherein the third electrode is disposed directly on the second insulating layer within the opening region.

5. The self-luminous display device according to claim 1, wherein, from a cross-section perspective, the first electrode and the second electrode are disposed below an entire width of the opening region.

6. The self-luminous display device according to claim 1, wherein the anode electrode and the third electrode are continuously formed as a single film.

7. The self-luminous display device according to claim 1, wherein a source or drain electrode of the drive transistor is a third portion of the first electrode layer.

8. The self-luminous display device according to claim 7, wherein the first portion and the third portion are separately formed.

9. The self-luminous display device according to claim 8, wherein the anode electrode is electrically connected to the first electrode.

10. The self-luminous display device according to claim 1, further comprising a drive circuit configured to drive the plurality of pixels,
wherein the drive circuit is configured to drive a respective one of the plurality of pixels such that:
the video signal is written to the holding capacitor via the write transistor during a sampling period, and
a potential of the gate electrode of the drive transistor rises in response to a rise of a potential of a source electrode of the drive transistor when a light emission period begins.

11. The self-luminous display device according to claim 10, wherein the drive circuit is configured to drive the respective one of the plurality of pixels such that the potential of the gate electrode of the drive transistor rises in response to the rise of the potential of the source electrode after the write transistor is set to a non-conductive state.

12. The self-luminous display device according to claim 10, wherein the drive circuit is configured to drive the respective one of the plurality of pixels such that the potential of the gate electrode of the drive transistor rises in response to the rise of the potential of the source electrode due to a bootstrap operation of the holding capacitor.

13. The self-luminous display device according to claim 12, wherein a bootstrap ratio of the bootstrap operation is dependent on a capacitance of the holding capacitor.

14. A self-luminous display device comprising:
a substrate;
a pixel array including a plurality of pixels arranged in a matrix on the substrate, respective ones of the plurality of pixels comprising a write transistor configured to write a video signal, a drive transistor configured to control a current based on the video signal, a holding capacitor configured to store a voltage dependent on the video signal, and a light emitting element configured to emit light in response to the current; and
a drive circuit configured to drive the pixels, wherein the holding capacitor includes:
a first electrode,
a second electrode disposed below the first electrode,
a first insulating layer interposed between the first electrode and the second electrode,
a third electrode disposed above the first electrode, and
a second insulating layer interposed between the first electrode and the third electrode,
the light emitting element includes an anode electrode, a cathode electrode, and a light emitting layer disposed between the anode electrode and the cathode electrode,
the anode electrode and the third electrode are continuously formed as a portion of a first electrode layer,
a planarization layer is disposed between the second insulating layer and the anode electrode,
a source or drain electrode of the drive transistor and the first electrode are distinctly formed as portions of a second electrode layer,
the anode electrode is connected to the first electrode via a first contact hole,
the second electrode is connected to a gate electrode of the drive transistor via a second contact hole,
the planarization layer has an opening region on the first electrode, and
the third electrode is disposed within the opening region.

15. The self-luminous display device according to claim 14, wherein the drive circuit is configured to drive a respective one of the plurality of pixels such that:
the video signal is written to the holding capacitor via the write transistor during a sampling period, and
a potential of the gate electrode of the drive transistor rises in response to a rise of a potential of a source electrode of the drive transistor when a light emission period begins.

16. The self-luminous display device according to claim 15, wherein the drive circuit is configured to drive the respective one of the plurality of pixels such that:
the potential of the gate electrode rises in response to the rise of the potential of the source electrode after the write transistor is set to a non-conductive state.

* * * * *